United States Patent
Sugiura

(10) Patent No.: US 7,397,443 B2
(45) Date of Patent: Jul. 8, 2008

(54) SPATIAL IMAGE TYPE DISPLAY

(75) Inventor: Satoshi Sugiura, Saitama-ken (JP)

(73) Assignee: Pioneer Corporation, Tokyo (JP)

( * ) Notice: Subject to any disclaimer, the term of this patent is extended or adjusted under 35 U.S.C. 154(b) by 576 days.

(21) Appl. No.: 10/501,338

(22) PCT Filed: Jan. 24, 2003

(86) PCT No.: PCT/JP03/00651

§ 371 (c)(1),
(2), (4) Date: Jul. 23, 2004

(87) PCT Pub. No.: WO03/063512

PCT Pub. Date: Jul. 31, 2003

(65) Prior Publication Data

US 2005/0104801 A1      May 19, 2005

(30) Foreign Application Priority Data

Jan. 24, 2002      (JP) .............................. 2002-015022

(51) Int. Cl.
*G09G 5/00*      (2006.01)
(52) U.S. Cl. .......................................... 345/1.1; 345/6
(58) Field of Classification Search .............. 345/1.1–6, 345/76–104
See application file for complete search history.

(56) References Cited

U.S. PATENT DOCUMENTS

| | | | | |
|---|---|---|---|---|
| 5,416,494 | A * | 5/1995 | Yokota et al. | 345/79 |
| 5,706,022 | A * | 1/1998 | Hato | 345/92 |
| 6,046,710 | A * | 4/2000 | Holden et al. | 345/6 |
| 6,181,301 | B1 * | 1/2001 | Inoguchi et al. | 345/5 |
| 6,522,381 | B1 * | 2/2003 | Brandt | 349/142 |
| 6,525,699 | B1 * | 2/2003 | Suyama et al. | 345/6 |
| 6,661,425 | B1 * | 12/2003 | Hiroaki | 345/629 |

* cited by examiner

*Primary Examiner*—Jimmy H Nguyen
(74) *Attorney, Agent, or Firm*—Arent Fox LLP

(57) ABSTRACT

A spatial image type display includes a front display device and a rear display device having display surfaces for displaying images in the same direction. The display devices are arranged with a predetermined spacing between their respective display surfaces. The display surfaces are provided with sub pixels formed at almost the same pixel pitches, and aligned with each other. Transparent regions are formed next to the respective sub pixels of the front display device. The light emitted from the sub pixels of the rear display device is transmitted through the transparent regions, and emitted toward the viewer along with the light emitted from the sub pixels of the front display device. A stereoscopic image is thus displayed in accordance with the brightnesses of the images displayed on the front display device and the rear display device. These display devices are made of an organic EL display or a liquid crystal display. Thus, there is provided a spatial image type display which is small in thickness, light in weight, and new in structure.

22 Claims, 18 Drawing Sheets

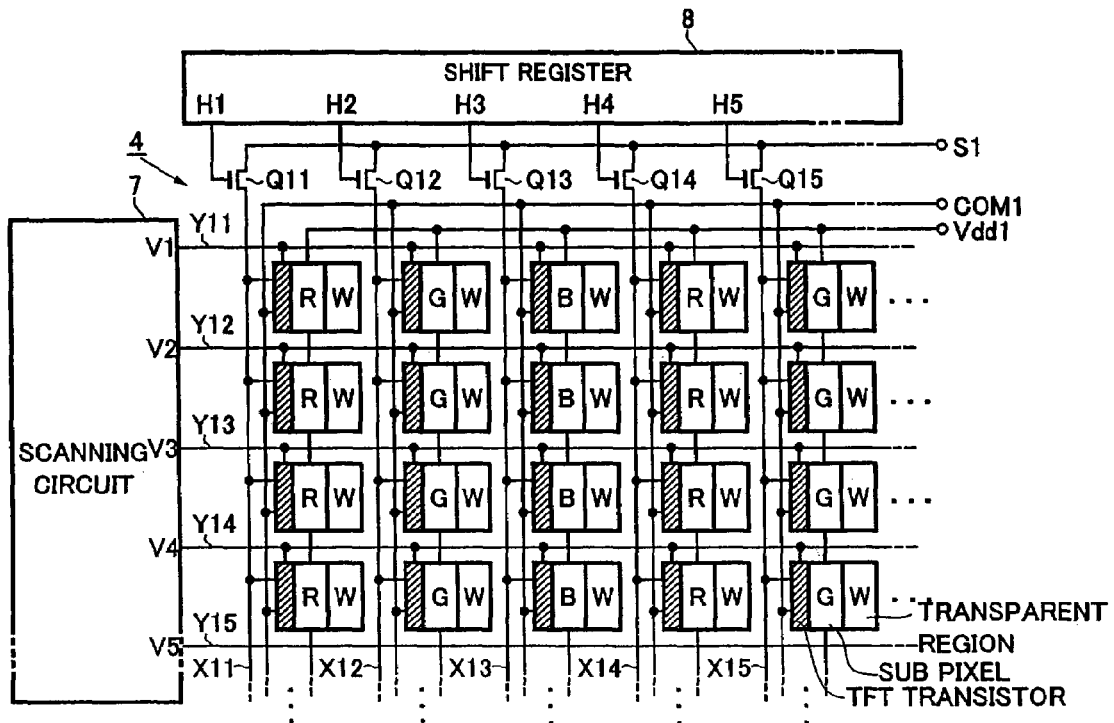
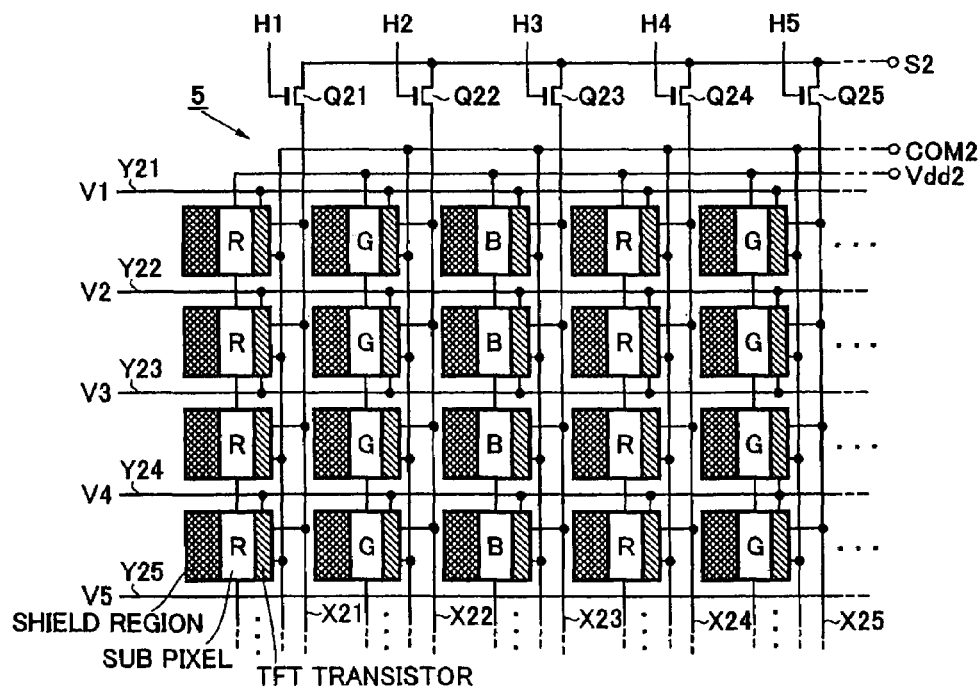

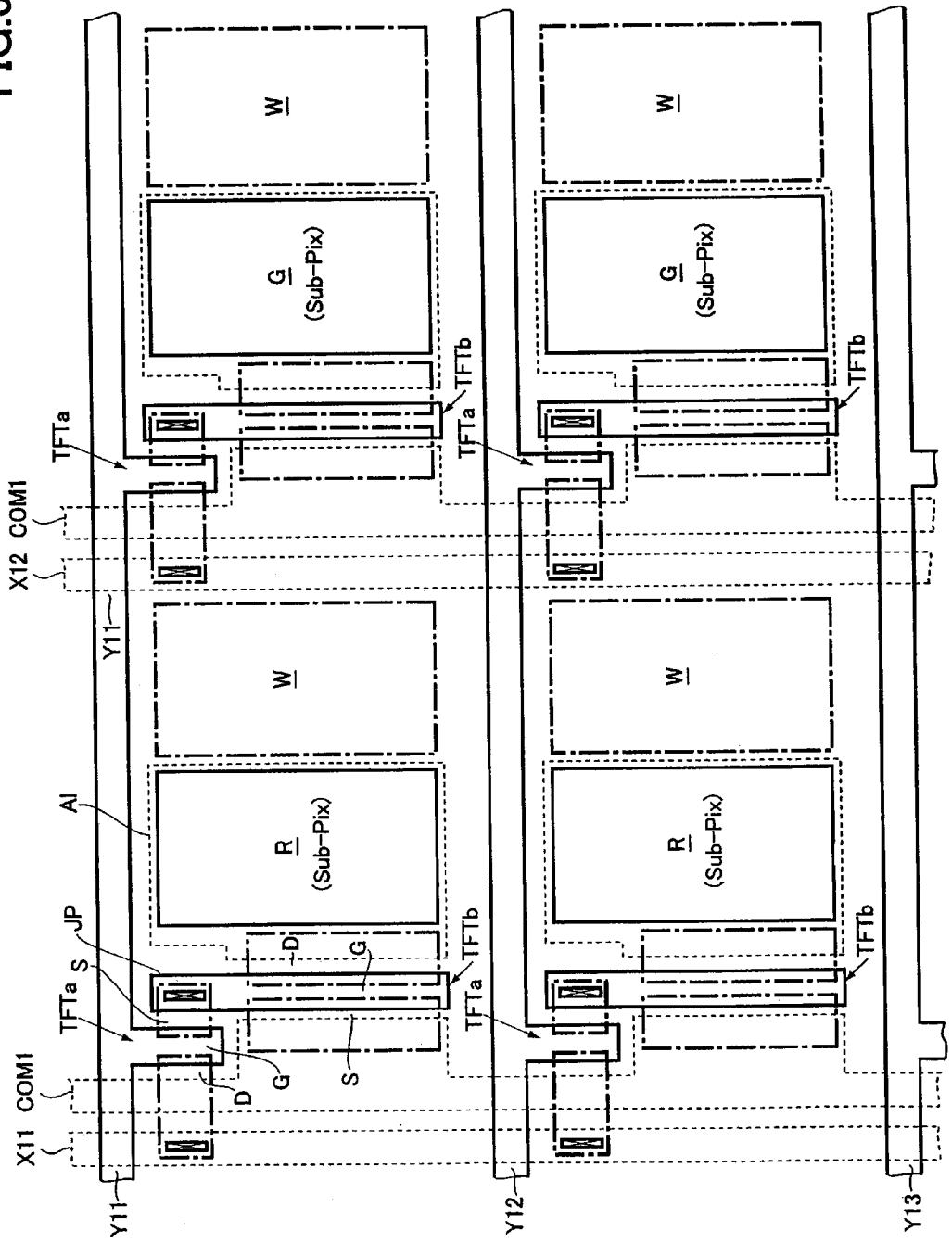

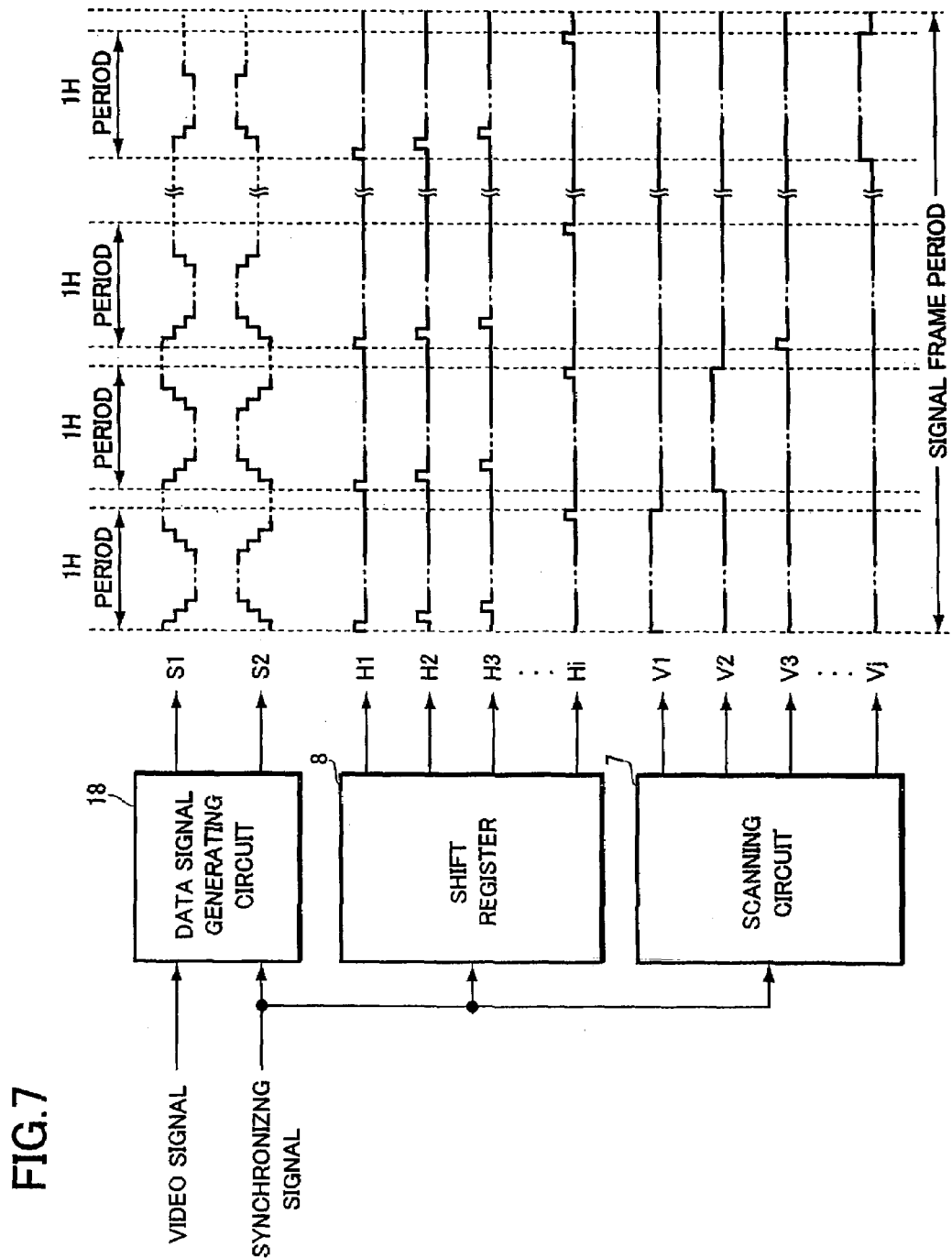

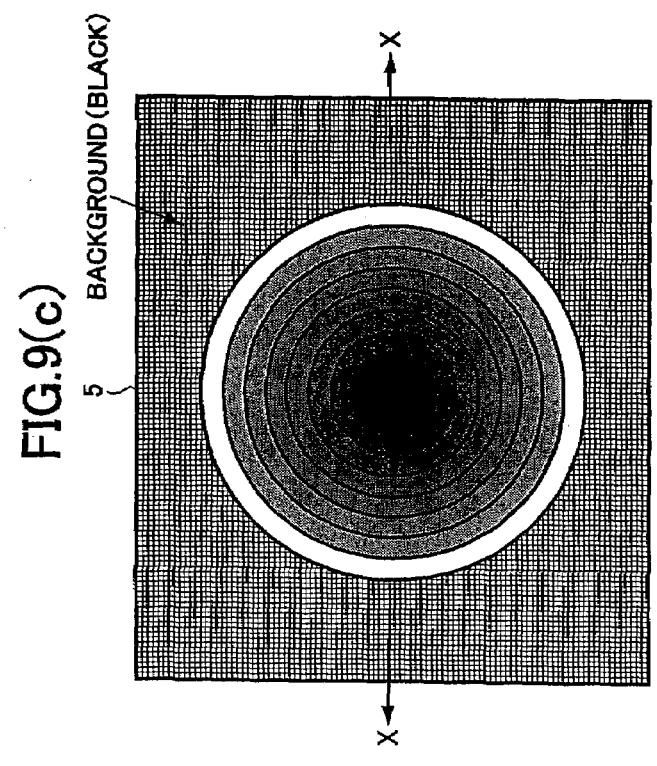
FIG.9(a)
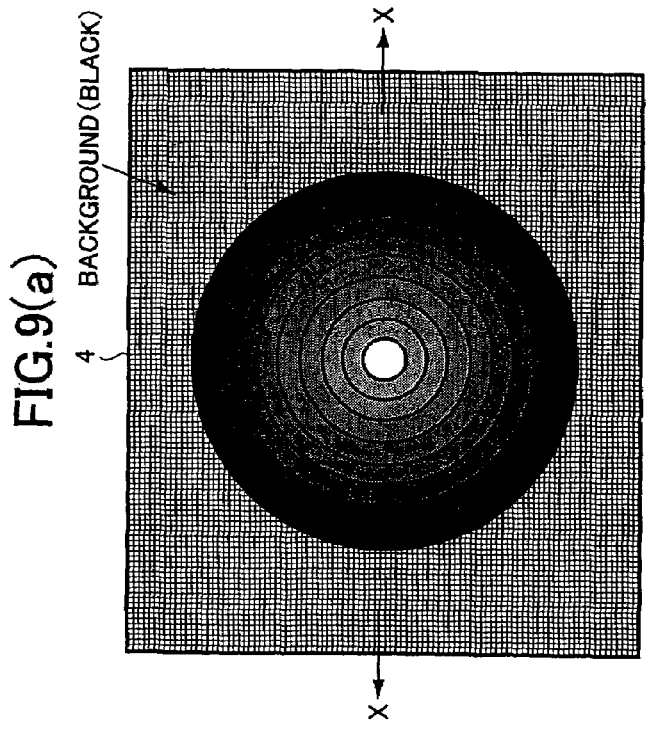
FIG.9(c)
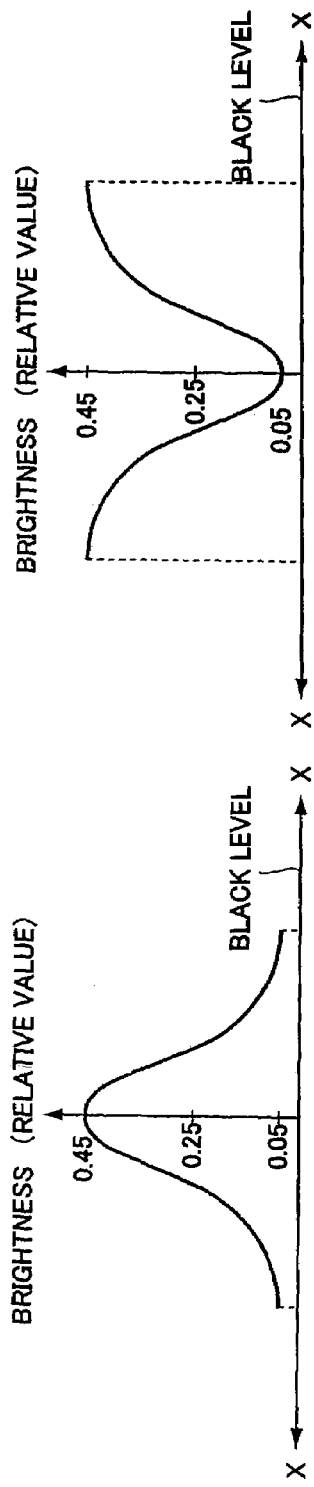
FIG.9(b)
FIG.9(d)

ABOUT US 7,397,443 B2

SPATIAL IMAGE TYPE DISPLAY

CROSS-REFERENCE TO RELATED APPLICATION

This application is a National Stage entry of International Application No. PCT/JP03/00651, filed Jan. 24, 2003, the entire specification claims and drawings of which are incorporated herewith by reference.

TECHNICAL FIELD

The present invention relates to a spatial image type display which displays an image in three dimensions, for example.

BACKGROUND ART

With the recent trend of information toward multimedia and the like, spatial image type displays for enabling realistic image display have been put under research and development.

Among the spatial image type displays under research are ones of a two-dimensional display system and ones of a three-dimensional display system.

A head mounted display (HMD) is known as a representative example of the spatial image type displays of the two-dimensional display system. The unitized apparatus, a combination of display devices and optical systems, is mounted on the head of a user, i.e., a viewer. When images displayed on the display devices are viewed through the optical systems, a virtual image formed in the front space appears as if an image is floating.

The spatial image type displays of the three-dimensional display system are typically referred to as stereoscopic displays, 3D displays, or the like, being broadly divided into eyeglass types and glassless types.

Among the known representative examples of the 3D displays of eyeglass type are ones of polarized glass type, shutter glass type, and head mounted display type (HMD type).

In the 3D display of polarized glass type, the display surface of the display shows right and left parallax images independently with light having polarized planes orthogonal to each other. A parallax is given to between the eyes of the viewer by using a pair of glasses having right and left orthogonal polarizers, so that a stereoscopic image can be displayed.

In the 3D display of shutter glass type, the display device switches to show right and left images alternately at predetermined cycles. A parallax is given to between the eyes of the viewer by using a pair of glasses which are alternately switched on/off in light transmittance in synchronization with the switching cycles, so that a stereoscopic image can be displayed.

In the 3D display of HMD type, the unitized apparatus, or a combination of display devices, optical systems, and a pair of glasses, is mounted on the head of the viewer. As with the polarized glass type and the shutter glass type, parallax images are given to the eyes of the viewer so that a stereoscopic image can be displayed.

Among the known representative examples of the 3D displays of glassless type are ones of parallax barrier type, lenticular lens type, and electronic holography type.

In the 3D display of parallax barrier type, the display surface of the display shows right and left images in strips alternately. The right and left images are viewed by the right and left eyes through a slit plate which is arranged in front of the display surface. Parallax images are thus given to the eyes of the viewer so that a stereoscopic image can be displayed.

In the 3D display of lenticular lens type, a screen plate, or an integration of small semi-cylindrical lenticular lenses, is arranged in front of the display surface of the display device instead of the slit plate which is arranged in the parallax barrier type. Right and left images are shown to the right and left eyes through the lenticular lenses, so that parallax images can be given to the eyes of the viewer to show a stereoscopic image.

The 3D display of electronic holography type uses a hologram, the three-dimensional shape of a subject to be recorded as interference fringes. This hologram is irradiated with illumination light so that it is reproduced as a real image or virtual image by the resulting diffraction light, thereby showing a stereoscopic image.

For the case of the head mounted display, i.e., the spatial image type display of the two-dimensional display system described above, the viewer must wear the heavy, large apparatus on the head and cover the eyes with the optical systems of the apparatus. Thus, there have been pointed out such drawbacks that wearing the apparatus is troublesome and inconvenient, and can cause eyestrain.

The 3D displays of eyeglass type are also known to have such drawbacks that the glasses must be worn troublesomely and inconveniently, and that eyestrain can occur since the right and left eyes view the parallax images alternately.

Among the 3D displays of glassless type, those of parallax barrier type and lenticular lens type are known to have a problem of extremely difficult application to general uses since the viewing angle at which the viewer can see precise binocular parallax images is extremely narrow and the stereoscopic image may disappear even with a slight head movement.

For the 3D display of electronic holography type, it is found difficult to develop a simple, small-sized holography device for realizing holography. A technical breakthrough has been expected, leaving an extreme difficulty in application to general uses.

In this research-and-development stage of spatial image type displays, an epoch-making research has been published. The following provides the display principle underlying the research.

FIG. 17 shows the display principle schematically. A front display surface PL1 and a rear display surface PL2 for displaying images toward the viewer are arranged opposite to each other. Two images displayed on the respective display surfaces PL1 and PL2 are shown to the viewer to produce such an illusion that a stereoscopic image appears in the space between the front display surface PL1 and the rear display surface PL2.

That is, the front display surface PL1 and the rear display surface PL2 both make display surfaces for emitting light toward the viewer by themselves. Besides, the image of the rear display surface PL2 is transmitted through the front display surface PL1 so that the viewer can see both the images of the front display surface PL1 and the rear display surface PL2.

The front display surface PL1 and the rear display surface PL2 show the same image along the direction of the optical axis (the direction of emission of light) though in different brightnesses. When the viewer views the overlaid images, the foregoing illusion shows a stereoscopic image as if lying in the space between the front display surface PL1 and the rear display surface PL2, thereby achieving stereoscopic display.

Here, when the front display surface PL1 shows an image F11 of certain brightness and the rear display surface PL2 shows an image F21 of the same shape, having brightness higher than that of the image F11, an image appears closer to the rear display surface PL2. When the front display surface PL1 and the rear display surface PL2 show images F12 and F22 of the same brightness and the same shape, an image appears at an intermediate position between the front display surface PL1 and the rear display surface PL2. When the front display surface PL1 shows an image F13 of higher brightness and the rear display surface PL2 shows an image F23 of lower brightness, an image appears closer to the front display surface PL1.

Thus, the display images on the front display surface PL1 and the rear display surface PL2 can be adjusted in brightness to achieve stereoscopic display.

To realize a spatial image type display based on the display principle of FIG. 17 requires, however, such components as a complicated optical system for displaying images on the front display surface PL1 and the rear display surface PL2. It has therefore been difficult to reduce the apparatus in weight, thickness, size, etc., with a problem of extremely difficult application to general uses.

For more details of the problem, FIG. 18 schematically shows possible configuration of a spatial image type display to which the display principle of FIG. 17 is applied.

This spatial image type display includes a liquid crystal display LCD1, a liquid crystal display LCD2, and a half mirror BS. The liquid crystal display LCD1 corresponds to the front display surface PL1. The liquid crystal display LCD2 corresponds to the rear display surface PL2. The half mirror BS reflects and transmits the images displayed on the display surfaces of the liquid crystal displays LCD1 and LCD2, respectively, and emits the resultant toward the viewer.

For the sake of self luminescence of the respective images, the liquid crystal displays LCD1 and LCD2 are provided with backlights BL1 and BL2, respectively.

According to this configuration, the images F11, F12, F13, etc. formed by the liquid crystal display LCD1 are reflected at the half mirror BS and emitted toward the viewer, realizing the front display surface PL1 shown in FIG. 17. The images F21, F22, F23, etc. formed by the liquid crystal display LCD2 are transmitted through the half mirror BS and emitted toward the viewer, realizing the rear display surface PL2.

Nevertheless, since the display surfaces of the liquid crystal displays LCD1 and LCD2 must be directed toward the half mirror BS, the liquid crystal display LCD1 is necessarily laid down along the depth direction. This increases the thickness d in the depth direction as shown in the diagram, causing a problem of yet greater size of the entire apparatus.

Note that FIG. 18 shows the basic configuration of the apparatus alone for convenience of explanation. In fact, the complicated optical system including the half mirror BS inevitably increases the overall weight of the apparatus. Consequently, there have been such problems that an increase occurs not only in the aforementioned thickness d in the depth direction but in width and height as well, and that the optical system is susceptible to vibrations etc. and is difficult to adjust for improved optical precision.

DISCLOSURE OF THE INVENTION

The present invention has been achieved in view of the foregoing problems. It is thus an object of the present invention to provide a spatial image type display which has a new structure capable of displaying a stereoscopic image, for example.

Another object of the present invention is to provide a spatial image type display which allows a reduction in weight, thickness, size, etc. for the sake of application to general uses. For example, the object is to provide a spatial image type display which allows a wide range of applications including a spatial image type display substitutable for a conventional CRT display or the like, portability-requiring applications such as a cellular phone, a personal digital assistant (PDA), and a personal computer, and vibration-prone applications such as a vehicle-mounted navigation system.

To achieve the foregoing objects, the present invention provides a spatial image type display including at least two display devices having respective display surfaces for displaying images in the same direction, the display surfaces being aligned with an appropriate spacing therebetween. The display surface of a front display device out of the at least two display devices lying in front and behind has a transparent region for transmitting the image on the display surface of a rear display device.

A number of pixels are formed on the display surfaces of the at least two display devices at a predetermined pixel pitch.

Otherwise, a number of pixels are formed on the display surfaces of the at least two display devices at different pixel pitches depending on the respective display devices.

The transparent region is formed at least in conformity with the pixel pitch on the display surface of the front display device.

Otherwise, the transparent region is formed at least in conformity with the pixel pitch on the display surface of the rear display device.

The display surfaces of the front display device and rear display device lying in front and behind display the same image with different brightnesses to make stereoscopic display.

Otherwise, the display surfaces of the front display device and rear display device lying in front and behind display split images to make stereoscopic display, the split images being obtained by splitting an image to be displayed.

According to the spatial image type display having the foregoing configuration, the front and rear display devices lying in front and behind show images on their respective display surfaces. At the time of display, the image displayed on the rear display device is transmitted through the transparent region of the front display device so that it is displayed, for example, toward the viewer along with the image displayed on the front display device. Consequently, the image displayed on the front display device and that on the rear display device realize stereoscopic display with what is called a sense of depth.

Moreover, when a number of pixels are formed on the display surfaces of the at least two display devices at a predetermined pixel pitch and the display devices show images, the images on the respective display devices realize stereoscopic display through synthesis or the like.

When a number of pixels are formed on the display surfaces of the at least two display devices at different pixel pitches depending on the display devices and the display devices show images, the images on the respective display devices realize high-quality stereoscopic display at least through mutual interpolation.

When the transparent region is formed at least in conformity with the pixel pitch on the display surface of the front display device, or at least in conformity with the pixel pitch on the display surface of the rear display device, the image displayed on the rear display device is transmitted through the transparent region of the front display device. The transmitted image and the image of the front display device realize stereoscopic display.

When the display surfaces of the front display device and rear display device lying in front and behind show the same image with different brightnesses, the images are synthesized into stereoscopic display.

When the display surfaces of the front display device and rear display device lying in front and behind show split images, which are obtained by splitting an image to be displayed, the split images interpolate each other to realize stereoscopic display.

Now, the foregoing display devices are made of an organic EL display each.

This configuration provides such effects that a thin, light, compact spatial image type display is achieved.

Otherwise, a rearmost display device out of the at least two display devices is made of a liquid crystal display, and the other display device(s) is/are made of an organic EL display each.

This configuration also provides such effects that a thin, light, compact spatial image type display is achieved.

BRIEF DESCRIPTION OF THE DRAWINGS

These and other objects and advantages of the present invention will become clearly understood from the following description with reference to the accompanying drawings, wherein:

FIGS. 2(a) and 2(b) are diagrams showing the structures of a front display device and a rear display device arranged in the spatial image type display shown in FIG. 1;

FIG. 5 is a diagram showing the structure of sub pixels and TFT transistors;

FIG. 7 is a diagram for explaining the operation of the spatial image type display of the first embodiment;

FIGS. 9(a) to 9(d) are diagrams further showing the display principle for a concrete case;

BEST MODE FOR CARRYING OUT THE INVENTION

Hereinafter, embodiments of the spatial image type display according to the present invention will be described with reference to the drawings.

First Embodiment

A first embodiment will be described with reference to FIGS. 1(a) through 8(b).

Figure 1A:
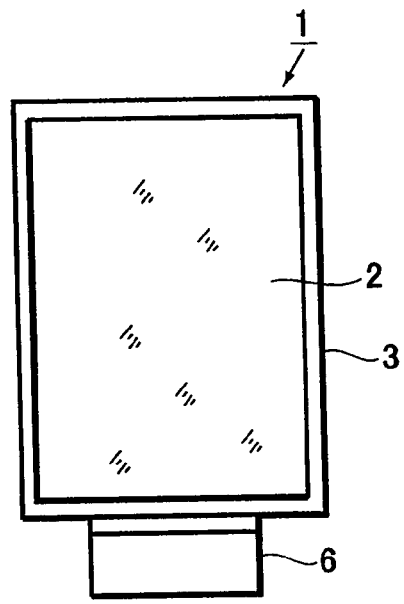
FIGS. 1(a) to 1(d) are diagrams showing the external shape and sectional structure of the spatial image type display according to a first embodiment.
Figure 1B:
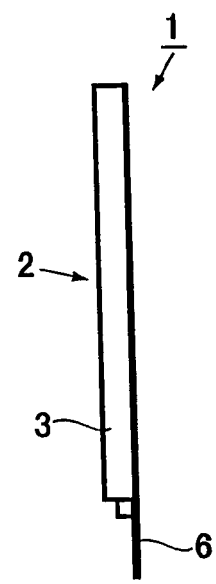
Figure 1C:
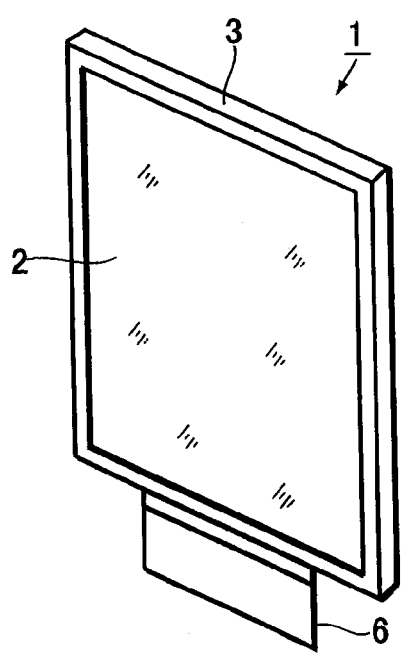

As shown in a plan view of FIG. 1(a), a spatial image type display 1 of the present embodiment has the structure that a display unit 2 for displaying a stereoscopic image toward the viewer is arranged in a frame 3. The spatial image type display 1 also has an extremely thin structure as shown in a side view of FIG. 1(b) and a perspective view of FIG. 1(c).

Figure 1D:
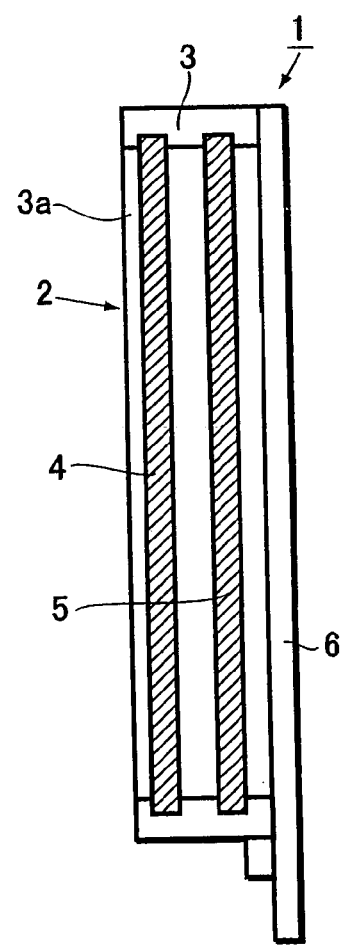

Moreover, as shown in an enlarged sectional view (FIG. 1(d)) taken along the depth direction, the display unit 2 consists of a thin front display device 4 and rear display device 5 which are closely arranged with a predetermined spacing therebetween. The front display device 4 is directed toward the viewer through an opening 3a of the frame 3. The rear display device 5 is arranged behind the front display device 4.

An electric circuit substrate 6 is attached to the rear end of the frame 3 appropriately. The electric circuit substrate 6 has a display control circuit for displaying images on the front display device 4 and the rear display device 5, respectively. When video signals are supplied to the electric circuit substrate 6 from an image information source, such as a video signal generating unit, through a flat cable or the like (not shown) electrically connected to the electric circuit substrate 6, the display control circuit mentioned above supplies the front display device 4 and the rear display device 5 with respective image data signals for image display.

Note that the electric circuit substrate 6 is attached to the rear end of the frame 3 solely by way of example. This electric circuit substrate 6 need not always be integrated with the spatial image type display 1. For example, the display control circuit mentioned above may be incorporated into the video signal generating unit or the like so that the image data signals output from the display control circuit are supplied directly to the front display device 4 and the rear display device 5 through a flat cable or the like.

The front display device 4 and the rear display device 5 are both organic electroluminescence (EL) displays of active matrix type, capable of full color display. The display devices have the numbers of pixels, resolutions, and display sizes appropriate to the field of application.

For example, when arranged in small-sized electronic equipment such as a cellular phone, the display devices have relatively small display surfaces of so-called 1.6-inch type, 2.1-inch type, etc. with the numbers of pixels of 100-200 dots a row/column on the display surfaces. With such electronic equipment as a PDA, a personal computer, and a vehicle-mounted navigation system, or electronic equipment which requires yet larger screen display, the display devices are provided with display surfaces of 3-inch type or above, for example. The numbers of pixels a row/column on the display surfaces are as much as the numbers of dots capable of VGA and SVGA, or high resolution display such as XGA and SXGA.

That is, the front display device 4 and the rear display device 5 are formed with the numbers of pixels, resolutions, and display sizes set as appropriate to the target electronic equipment.

Figure 3:
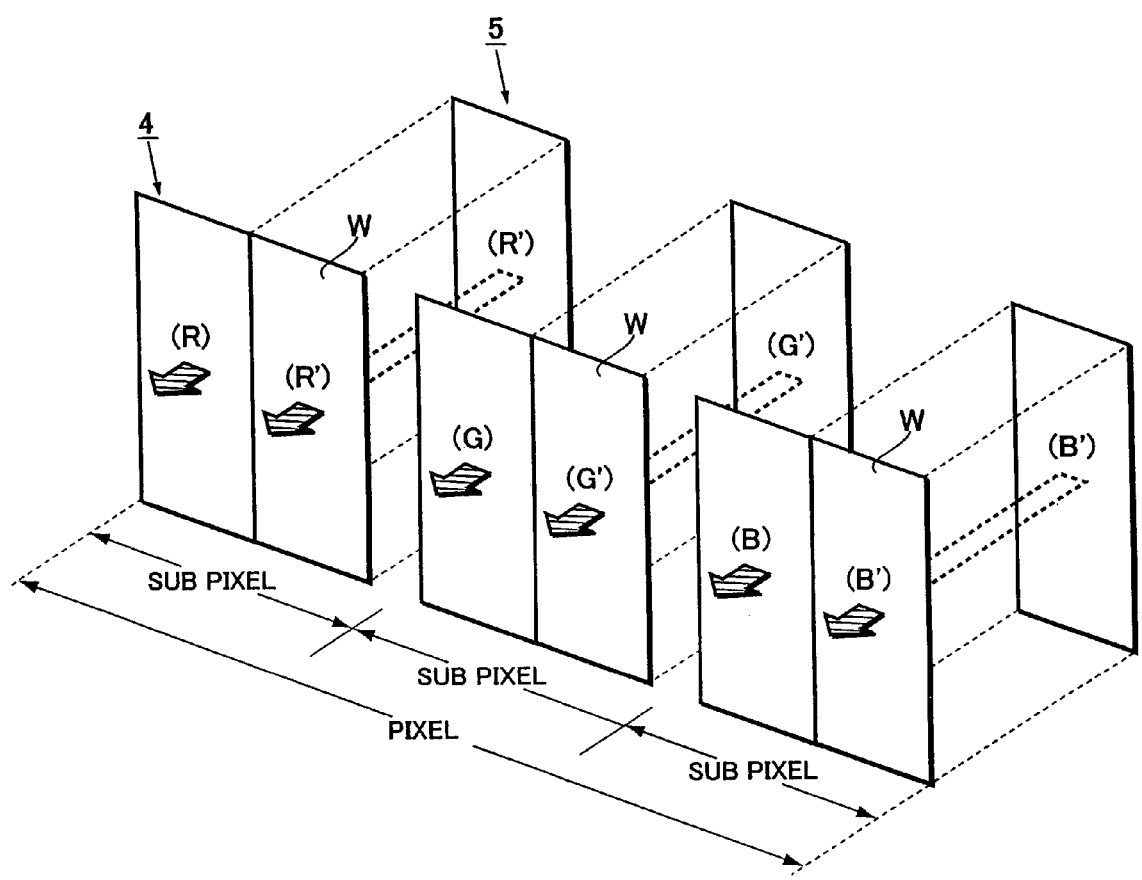
FIG. 3 is a perspective view showing the physical relationship of sub pixels formed on the display surfaces of the front display device and the rear display device.

FIGS. 2(a) to 3 show the matrix structures of the pixels formed on the respective display surfaces of the front display device 4 and the rear display device 5.

FIG. 2(a) shows the pixel matrix of the front display device 4, and FIG. 2(b) the pixel matrix of the rear display device 5. The pixels of the front display device 4 and those of the rear display devices 5 are shown associated with each other in physical relationship.

In FIG. 2(a), the front display device 4 has numbers of independent sub pixels for emitting red (R) light, green (G) light, and blue (B) light. The sub pixels are arranged vertically and horizontally at respective regular pixel pitches.

Transparent regions (W) are also formed next to the respective red (R), green (G), and blue (B) sub pixels. The transparent regions (W) transmit light emitted from red (R), green (G), and blue (B) sub pixels which are formed in a matrix on the rear display device shown in FIG. 2(b), respectively.

On the front display device 4, red, green, and blue (R, G, and B), three sub pixels adjoining horizontally constitute each single pixel. The red (R) light, green (G) light, and blue (B) light emitted from these three sub pixels reproduce a single pixel of color.

A number of address signal lines (hereinafter, referred to as "gate lines") Y11, Y12, Y13, Y14, Y15 . . . extending horizontally for the sake of vertical scanning and a number of data lines X11, X12, X13, X14, X15 . . . extending vertically for the sake of supply of an image data signal S1 are formed between the sub pixels of the front display device 4.

The gate lines Y11, Y12, Y13, Y14, Y15 . . . are connected with a scanning circuit 7 which is arranged in the display control circuit mentioned above. The scanning circuit 7 outputs address signals V1, V2, V3, V4, V5 . . . to the gate lines Y11, Y12, Y13, Y14, Y15 . . . , respectively. The address signals vary in logic level successively and exclusively in synchronization with so-called horizontal scanning periods.

The data lines X11, X12, X13, X14, X15 . . . are connected with transistors Q11, Q12, Q13, Q14, Q15 . . . , respectively, which are analog switches arranged in the display control circuit mentioned above. These transistors Q11, Q12, Q13, Q14, Q15 . . . are then connected to a shift register 8 for turning on/off the transistors successively and exclusively in synchronization with so-called dot sequential scanning periods.

That is, in accordance with dot sequential scanning signals H1, H2, H3, H4, H5 . . . to be supplied from the shift register 8, the transistors Q11, Q12, Q13, Q14, Q15 . . . turn on/off successively and exclusively in synchronization with dot sequential scanning periods so that the image data signal S1 is assigned and supplied to the data lines X11, X12, X13, X14, X15 . . . in succession.

Moreover, TFT transistors are formed as analog switches at portions where the gate lines Y11, Y12, Y13, Y14, Y15 . . . and the data lines X11, X12, X13, X14, X15 . . . intersect each other (the hatched portions in the diagram). The individual TFT transistors are electrically connected to the aforementioned red, green, and blue (R, G, and B) sub pixels, as well as the gate lines Y11, Y12, Y13, Y14, Y15 . . . and the data lines X11, X12, X13, X14, X15 . . . in the respective intersecting portions described above.

Then, the scanning circuit 7 supplies the gate lines Y11, Y12, Y13, Y14, Y15 . . . with the respective address signals V1, V2, V3, V4, V5 . . . so that the TFT transistors aligning horizontally turn on/off row by row in synchronization with the horizontal scanning periods. Meanwhile, the shift register 8 and the transistors Q11, Q12, Q13, Q14, Q15 . . . assign and supply the image data signal S1 to the data lines X11, X12, X13, X14, X15 . . . in synchronization with the dot sequential scanning periods so that the image data signal S1 is supplied to the sub pixels through the respective TFT transistors. Consequently, the individual sub pixels emit light in synchronization with the horizontal scanning periods and the dot sequential scanning periods, thereby displaying a desired image.

Here, the front display device 4 is arranged in the frame 3 so that its display surface having the above-described sub pixels formed thereon faces toward the viewer. The front display device 4 thus emits self luminescence of the individual sub pixels toward the viewer.

The front display device 4 also has a power supply line Vdd1 for supplying a power supply voltage, and a common line COM1 which is set at a ground level.

Now, the rear display device 5 has a display surface on which a number of sub pixels are formed in a matrix as with the front display device 4. The rear display device 5 is arranged in the frame 3 with its display surface toward the viewer.

That is, in FIG. 2(b), the rear display device 5 has numbers of independent sub pixels for emitting red (R) light, green (G) light, and blue (B) light by themselves. The sub pixels are arranged vertically and horizontally at respective regular pixel pitches.

On the rear display device 5, red, green, and blue (R, G, and B), three sub pixels adjoining horizontally constitute each single pixel. The red (R) light, green (G) light, and blue (B) light emitted from these three sub pixels reproduce a single pixel of color.

It should be noted here that the pixel pitches of the rear display device 5 are almost the same as those of the front display device 4, and the total number of sub pixels is almost the same as that of the front display device 4.

That is, the display surface of the rear display device 5 has size, the number of pixels, and resolution almost the same as those of the display surface of the front display device 4. As a result, the sub pixels of the rear display device 5 and the sub pixels of the front display device 4 are in near perfect alignment spatially.

As seen in the direction of the optical axis (the direction of emission of light), however, the sub pixels of the rear display device 5 are aligned opposite to the respective transparent regions W formed on the front display device 4.

Consequently, as schematically shown in the perspective view of FIG. 3, the red, green, and blue (R, G, and B), three sub pixels which constitute each single pixel formed on the front display device 4 emit R light, G light, and B light toward the viewer, respectively. The red, green, and blue (R, G, and B), three sub pixels which constitute each single pixel formed on the rear display device 5 emit R' light, G' light, and B' light, respectively, which are transmitted through the three transparent regions W formed next to the foregoing sub pixels of the front display device 4, and emitted toward the viewer.

Since the pixels of the front display device 4 and those of the rear display device 5 are thus aligned spatially, the pixels of the front and rear display devices 4 and 5 in alignment with each other constitute three-dimensional pixels having a depth.

Returning to FIG. 2(b), a number of gate lines Y21, Y22, Y23, Y24, Y25 . . . extending horizontally for the sake of vertical scanning and a number of data lines X21, X22, X23, X24, X25 . . . extending vertically for the sake of supply of an image data signal S2 are formed between the sub pixels of the rear display device 5.

The gate lines Y21, Y22, Y23, Y24, Y25 . . . are connected with the scanning circuit 7 described previously. The scanning circuit 7 outputs the address signals V1, V2, V3, V4, V5 . . . to the gate lines Y21, Y22, Y23, Y24, Y25 . . . , respectively. The address signals vary in logic level successively and exclusively in synchronization with the horizontal scanning periods described previously.

The data lines X21, X22, X23, X24, X25 . . . are connected with transistors Q21, Q22, Q23, Q24, Q25 . . . , respectively, which are analog switches arranged in the display control circuit described previously. These transistors Q21, Q22, Q23, Q24, Q25 are then connected to the shift register 8.

That is, in accordance with the dot sequential scanning signals H1, H2, H3, H4, H5 . . . to be supplied from the shift register 8, the transistors Q21, Q22, Q23, Q24, Q25 . . . turn on/off successively and exclusively in synchronization with the dot sequential scanning periods so that the image data signal S2 is assigned and supplied to the data lines X21, X22, X23, X24, X25 . . . in succession.

Besides, TFT transistors are formed as analog switches at portions where the gate lines Y21, Y22, Y23, Y24, Y25 . . . and the data lines X21, X22, X23, X24, X25 . . . intersect each other (the hatched portions in FIG. 2(b)). The individual TFT transistors are electrically connected to the aforementioned red, green, and blue (R, G, and B) sub pixels, as well as the gate lines Y21, Y22, Y23, Y24, Y25 . . . and the data lines X21, X22, X23, X24, X25 . . . in the respective intersecting portions described above.

Then, the scanning circuit 7 supplies the gate lines Y21, Y22, Y23, Y24, Y25 . . . with the address signals V1, V2, V3, V4, V5 . . . , respectively, so that the TFT transistors aligning horizontally turn on/off row by row in synchronization with the horizontal scanning periods. The shift register 8 and the transistors Q21, Q22, Q23, Q24, Q25 . . . assign and supply the image data signal S2 to the data lines X21, X22, X23, X24, X25 . . . in synchronization with the dot sequential scanning periods so that the image data signal S2 is supplied to the sub pixels through the respective TFT transistors. Consequently, the individual sub pixels emit light in synchronization with the horizontal scanning periods and the dot sequential scanning periods to display a desired image.

The double-hatched areas in FIG. 2(b) are portions corresponding to the sub pixels for emitting red, green, and blue (R, G, and B) light in the front display device 4 shown in FIG. 2(a). The double-hatched areas thus make shield regions for emitting no light, given shielding with black dies, for example.

As described previously, the matrix arrangement of the sub pixels of the front display device 4 and the matrix arrangement of the sub pixels of the rear display device 5 are in near perfect alignment. The pixels of the front and rear display devices 4 and 5 in alignment with each other are subjected to horizontal scanning and dot sequential scanning with the same address signals V1, V2, V3, V4, V5 . . . and dot sequential scanning signals H1, H2, H3, H4, H5 . . . . The image data signal S1 for the front display device 4 and the image data signal S2 for the rear display device 5 are thus supplied synchronously by each three-dimensional pixel shown in FIG. 3. Consequently, the sub pixels of the front display device 4 and those of the rear display device 5 emit light in units of three-dimensional pixels, not in a spatially independent fashion.

Like the front display device 4, the rear display device 5 also has a power supply line Vdd2 for supplying a power supply voltage and a common line COM2 which is set at a ground level.

Now, with reference to FIGS. 4-6(b), description will be given of the device structure of the front display device 4 and the rear display device 5 which are made of an organic EL display each.

Figure 4:
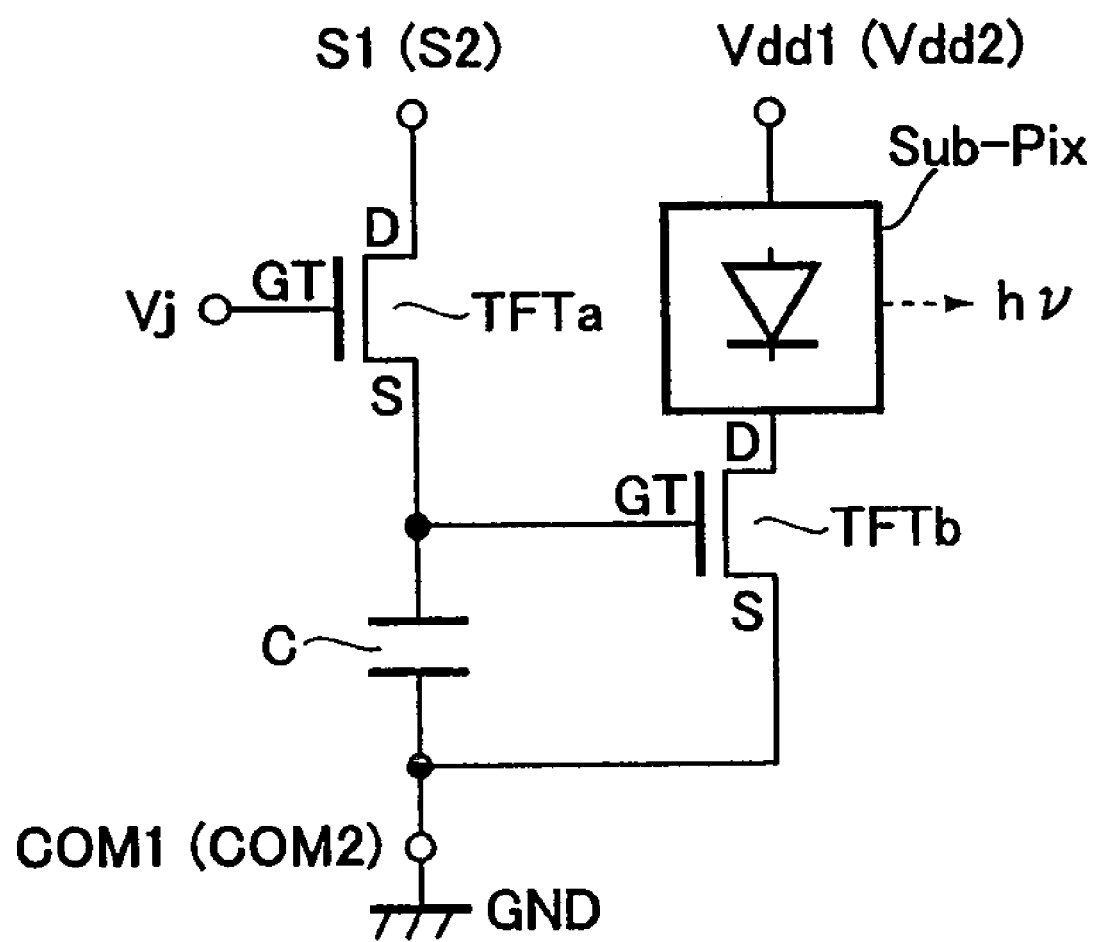
FIG. 4 is a diagram showing the configuration of a circuit for supplying an image data signal to a sub pixel.

FIG. 4 is a circuit diagram showing the configuration of each sub pixel on the front display device 4 and the rear display device 5, in which TFT transistors TFTa and TFTb are connected to each other. As described previously, these TFT transistors TFTa and TFTb are formed at the portions where the data lines X11-X15 . . . X1i and the gate lines Y11-Y15 . . . Y1j intersect each other and where the data lines X21-X25 . . . X2i and the gate lines Y21-Y25 . . . Y2j intersect each other.

That is, the gate of the TFT transistor TFTa (hereinafter, referred to simply as "TFTa") is connected to one of the address signal lines so that the address signal Vj is supplied thereto from the scanning circuit 7. In addition, the drain of the TFTa is connected to one of the data lines so that the image data signal S1 (or S2) is supplied thereto.

The source of the TFTa is connected to the gate of the TFT transistor TFTb (hereinafter, referred to simply as "TFTb"). The source is also connected to the common line COM1 (or COM2), which is set at the ground level, through a storage capacitor C.

The source of the TFTb is connected to the common line COM1 (or COM2). The aforementioned sub pixel Sub-Pix is connected between the drain and the power supply line Vdd1 (or Vdd2).

In this circuit configuration, when the gate of the TFTa is supplied with the address signal Vj of logic level "H" from the scanning circuit 7, the TFTa turns on. As a result, the image data signal S1 (or S2) supplied to the drain of the TFTa is fed through its source to the gate of the TFTb and is held by the storage capacitor C.

Then, the TFTb amplifies the supplied image data signal S1 (or S2) in voltage. The TFTb applies a voltage difference between the amplified voltage (drain voltage) and the voltage of the power supply line Vdd1 (or Vdd2) to across the sub pixel Sub-Pix so that the sub pixel Sub-Pix emits light hv having an intensity proportional to the voltage difference by itself. Here, the sub pixel Sub-Pix gives the self luminescence of light hv in any of red, green, and blue (R, G, and B).

Next, with reference to FIG. 5, description will be given of the two-dimensional structure of the TFTas, TFTbs, and sub pixels Sub-Pix formed on the front display device 4.

FIG. 5 is a layout diagram to be created in designing the organic EL display. For the representative configuration of essential parts, FIG. 5 shows the structure of four sub pixels Sub-Pix for emitting red (R) light and green (G) light, associated with the gate lines Y11, Y12 and the data lines X11, X12 shown in FIG. 2(a), and the accompanying TFTas and TFTbs.

Incidentally, these sub pixels Sub-Pix and the TFTas, TFTbs have the same device structures. For convenience of explanation, the following description will deal with the two-dimensional structure of the sub pixel Sub-Pix for emitting red (R) light which is associated with the gate line Y11 and the data line X11, and the accompanying TFTa and TFTb.

In the diagram, the gate lines Y11, Y12 . . . are laminated on a not-shown transparent glass substrate. The data lines X11, X12 . . . and the common line COM1 are formed so as to intersect the gate lines Y11, Y12 . . . without electric contact.

The drain D and the source S of the TFTa are opposed to each other with a predetermined spacing therebetween. A gate electrode, a part of the gate line Y11, is arranged with a predetermined spacing over the portion where the drain D and the source S are opposed to each other. This forms a gate GT under the gate electrode.

The drain D and the source S of the TFTb are opposed to each other with a predetermined spacing therebetween. A gate electrode JP, connected to the drain D of the TFTa, is arranged with a predetermined spacing over the portion where the drain D and the source S are opposed to each other. This forms a gate GT of the TFTb under the gate electrode JP.

A back electrode layer Al is arranged on the drain-D side of the TFTb. The back electrode layer Al has almost the same size as that of the light emitting surface of the sub pixel Sub-Pix for emitting red (R) light, and is electrically connected with the drain D of the TFTb.

The source S of the TFTb is electrically connected with the common line COM1.

Although not shown in FIG. 5, an electron injection layer, a light emitting layer, a hole injection layer, and a transparent electrode layer are laminated in succession on the back electrode layer Al described above. The transparent electrode layer is connected with the power supply line Vdd1. Consequently, the back electrode layer Al in connection with the drain D of the TFTb, the transparent electrode layer in connection with the power supply line Vdd1, and the electron injection layer, light emitting layer, and hole injection layer laminated therebetween form an organic EL device for emitting red (R) light.

In addition, the aforementioned transparent region W is arranged beside the light emitting surface of the sub pixel Sub-Pix for emitting red (R) light. The transparent region W is formed by laminating, on the transparent glass substrate, a transparent insulating layer alone as a protective layer.

The rear display device 5 has basically the same structure as that of the front display device 4 except that no transparent region W is formed thereon. Description will thus be omitted of the two-dimensional structure of the sub pixels and the TFT transistors of the rear display device 5.

Now, with reference to FIGS. 6(a) and 6(b), description will be given of the sectional structure of the sub pixels Sub-Pix and the TFT transistors formed on the front display device 4 and the rear display device 5.

Figure 6A:
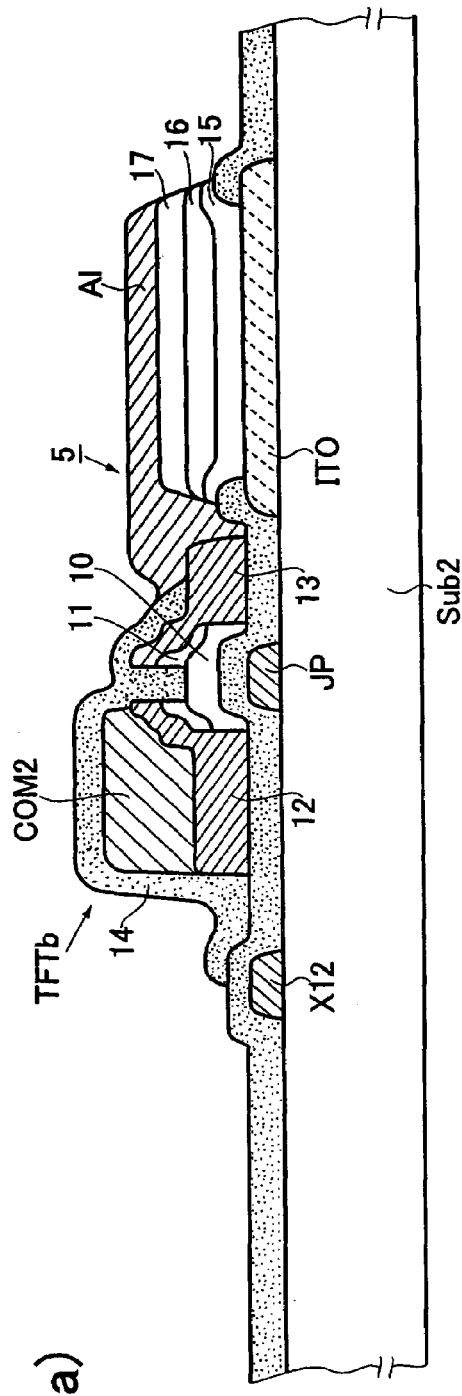
FIGS. 6(a) and 6(b) are sectional views further showing the device structure of the sub pixels and the TFT transistors.
Figure 6B:
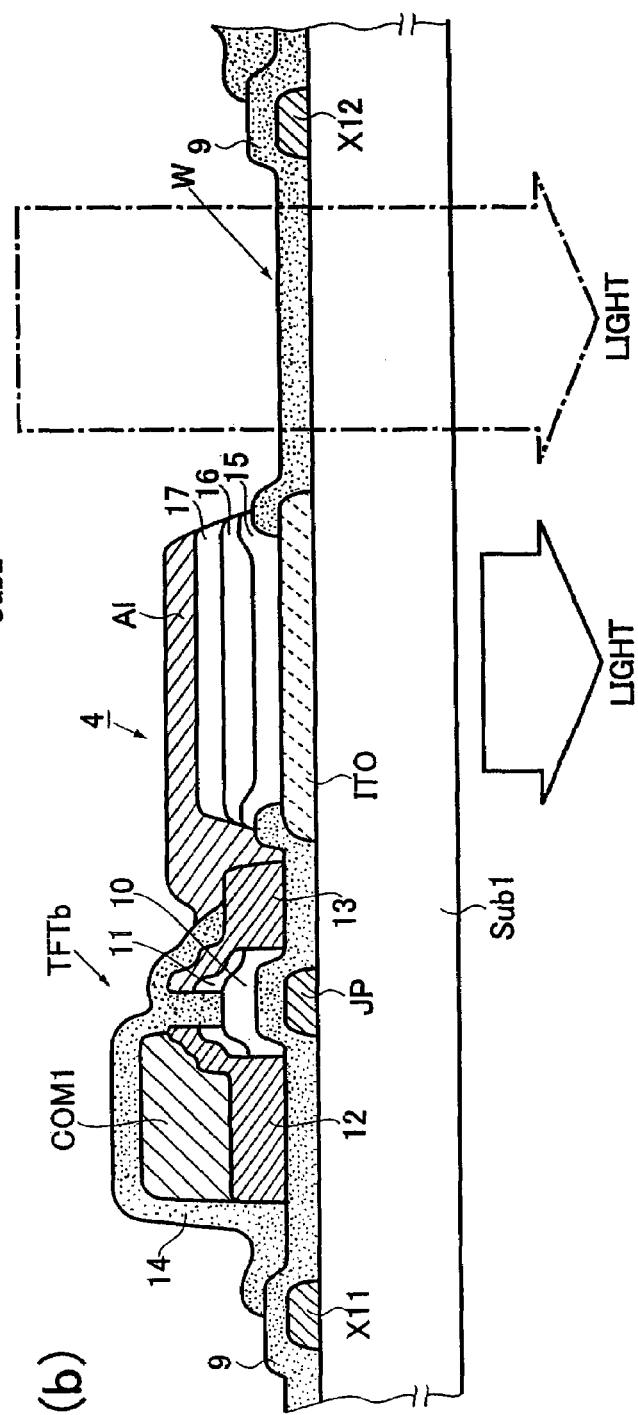

FIGS. 6(a) and 6(b) represent the structure of essential parts of the sub pixel Sub-Pix for emitting red (R) light in association with the gate line Y11 and the data line X11 of the front display device 4 and the accompanying TFTb shown in FIG. 5, and the structure of essential parts of the sub pixel Sub-Pix etc. of the rear display device 5 which are in alignment with the sub pixel Sub-Pix etc. of the front display device 4. FIG. 6(a) shows the structure of the rear display device 5, and FIG. 6(b) the structure of the front display device 4. Light shall be emitted to the sides of transparent glass substrates Sub1 and Sub2.

Since the front display device 4 and the rear display device 5 have almost the same device structures as described, the common parts are designated by identical reference numerals or symbols.

Initially, with reference to FIG. 6(b), description will be given of the structure of the representative sub pixel Sub-Pix etc. on the front display device 4. The data line X11 is laminated on the surface of the transparent glass substrate Sub1. The gate electrode JP and a transparent electrode layer ITO are also laminated in connection with the source S of the TFTa shown in FIG. 5 and the power supply line Vdd1 (not shown), respectively.

The data line X11 and the gate electrode JP are covered with an insulating layer 9. An amorphous silicon (a-Si) layer 10 and an n+ type amorphous silicon layer 11 are laminated on the gate electrode JP via the insulating layer 9.

The amorphous silicon layer 10 and the n+ type amorphous silicon layer 11 make the gate GT of the TFTb in the area opposite to the gate electrode JP. The area on the left of the gate electrode JP makes the source S of the TFTb, and the area on the right of the gate electrode JP the drain D of the TFTb.

Moreover, a source electrode 12 and a drain electrode 13 are laminated on the insulating layer 9. The source electrode 12 is laminated to cover the left parts of the amorphous silicon layer 10 and the n+ type amorphous silicon layer 11, and thus is connected to the source S of the TFTb electrically. The drain electrode 13 is laminated to cover the right parts of the amorphous silicon layer 10 and the n+ type amorphous silicon layer 11, and thus is connected to the drain D of the TFTb electrically.

The common line COM1 is laminated on the source electrode 12, so that the source S of the TFTb and the common line COM1 are connected to each other through the source electrode 12.

Then, the entire TFTb is covered with an insulating film 14.

Furthermore, a hole injection layer 15, a light emitting layer 16, and an electron injection layer 17 are laminated on the transparent electrode layer ITO mentioned above. The back electrode layer Al for establishing electric connection with the drain electrode 13 is laminated on the electron injection layer 17.

When a voltage proportional to the image data signal S1 is applied to the back electrode layer Al through the TFTb as described previously, electrons are injected into the light emitting layer 16 from the electron injection layer 17 and holes are injected into the light emitting layer 16 from the hole injection layer 15 in accordance with a voltage difference between the applied voltage and the voltage of the transparent electrode layer ITO which is in connection with the power supply line Vdd1. With the recombination energy of the electrons and holes, light is emitted to the side of the glass substrate Sub1.

Beside the transparent electrode layer ITO, the insulating layer 9 alone is laminated on the glass substrate Sub1 with none of so-called devices. This forms a transparent region W for transmitting light emitted from the rear display device 5.

Although not shown in the diagrams, the areas excluding the transparent regions W are covered with black dies so that the light emitted from the sub pixels of the rear display device 5 is transmitted through the respective transparent regions W alone and emitted toward the viewer.

FIG. 6(a) shows the sub pixel Sub-Pix of the rear display device 5, which is formed at a position to emit light toward the transparent region W of the front display device 4 shown in FIG. 6(b). The rear display device 5 is basically the same as the front display device 4 in device structure except that no transparent region W is formed thereon.

Now, with reference to FIGS. 7-8(b), description will be given of the operation of the spatial image type display 1 which has been described in conjunction with FIGS. 1(a)-6(b).

FIG. 7 shows the dot sequential scanning signals H1, H2, H3, H4, H5 . . . synchronous to the dot sequential scanning periods, and the address signals V1, V2, V3, V4, V5 . . . synchronous to the horizontal scanning periods (1H periods). The dot sequential scanning signals H1, H2, H3, H4, H5 . . .

and the address signals V1, V2, V3, V4, V5 . . . are output from the shift register 8 and the scanning circuit 7, respectively, which are arranged in the display control circuit described previously.

The display control circuit also includes a data signal generating circuit 18. The data signal generating circuit 18 generates the image data signal S1 to be supplied to the front display device 4 and the image data signal S2 to be supplied to the rear display device 5 when it is supplied with a video signal VD as a signal source.

Here, the data signal generating circuit 18 generates the image data signals S1 and S2 in synchronization with the dot sequential scanning signals H1, H2, H3, H4, H5 . . . and the address signals V1, V2, V3, V4, V5 . . . , based on a synchronizing signal CLK of predetermined frequency supplied from an oscillation source (not shown).

Moreover, in displaying a stereoscopic image based on the video signal VD, the data signal generating circuit 18 generates the image data signals S1 and S2 from the video signal VD so that the same image is displayed in alignment on the display surfaces of the front display device 4 and the rear display device 5.

That is, both the image data signal S1 and the image data signal S2 are basically the same as the video signal VD.

Nevertheless, the amplitudes of the image data signals S1 and S2 are set in accordance with the depth of each portion of the stereoscopic image with respect to a reference position, which is the assumed position of the viewer.

That is, to display a portion of the stereoscopic image closer to the foregoing reference position, the image data signal S1 is rendered higher than the image data signal S2 in amplitude. In contrast, to display a portion farther from the reference position, the image data signal S1 is rendered lower than the image data signal S2 in amplitude.

In this way, the image data signals S1 and S2 adjusted in amplitude are generated in synchronization with the horizontal scanning periods (1H periods), a single frame period, and the dot sequential scanning periods. The image data signals S1 and S2 generated are supplied to the front display device 4 and the rear display device 5 to show images on the respective display surfaces.

Thus, images appear on the front display device 4 and the rear display device 5. As shown in FIG. 8(*a*), when image data signals S1 of higher amplitudes are supplied to the front display device 4 and image data signals S2 of lower amplitudes are supplied to the rear display device 5, the front display device 4 shows an image of higher brightness and the rear display device 5 shows an image of lower brightness. This gives the viewer the illusion that an image Pa lies at a position closer to the front display device 4.

As shown in FIG. 8(*b*), when image data signals S1 of lower amplitudes are supplied to the front display device 4 and image data signals S2 of higher amplitudes are supplied to the rear display device 5, the front display device 4 shows an image of lower brightness and the rear display device 5 shows an image of higher brightness. This gives the viewer the illusion that an image Pb lies at a position closer to the rear display device 5.

Consequently, the image data signals S1 and S2 adjusted in amplitude so as to control the brightnesses of the individual portions of the images to be displayed on the front display device 4 and the rear display device 5 can be supplied to reproduce and display a stereoscopic image to the viewer.

For example, the display surface of the front display device 4 shows a subject image which varies concentrically in brightness on a black background as shown in FIG. 9(*a*). Meanwhile, the display surface of the rear display device 5 shows a subject image which varies concentrically in brightness on a black background as shown in FIG. 9(*c*). When these subject images are displayed in spatial alignment with each other, the three-dimensional image of a cone-shaped stereoscopic image shown in FIG. 10 can be presented to the viewer as viewed from the top side.

Here, FIG. 9(*b*) shows brightness variations of the subject image shown in FIG. 9(*a*), taken along a virtual line X-X. FIG. 9(*d*) shows brightness variations of the subject image shown in FIG. 9(*c*), taken along a virtual line X-X. Here, the brightness of each single pixel of the front display device 4 and the brightness of each single pixel of the rear display device 5 are shown relatively (normalized) with the sum of brightnesses of the light emitted from sub pixels for a single stereoscopic pixel shown in FIG. 3 as 1.

As shown in FIGS. 9(*b*) and 9(*d*), the subject image increasing in brightness toward the center of the concentric circles is displayed on the display surface of the front display device 4 and the subject image decreasing in brightness toward the center of the concentric circles is displayed on the display surface of the rear display device 5. This can present the three-dimensional image of the cone-shaped stereoscopic image shown in FIG. 10 as viewed from the top side. As described previously, stereoscopic three-dimensional images can thus be displayed by adjusting the individual pixels of the front display device 4 and the rear display device 5 in brightness appropriately.

As has been described, in the spatial image type display 1 of the present embodiment, the front display device 4 and the rear display device 5 are made of organic EL displays. This allows a reduction in thickness and weight.

As described with reference to FIG. 3, the light emitted from the sub pixels of the rear display device 5 is transmitted through the transparent regions W formed on the front display device 4. The transmitted light and the light emitted from the sub pixels formed on the front display device 4 can be combined to determine the color, brightness, and spatial position of the stereoscopic image. This eliminates the need for a complicated optical system as in the conventional art. It is therefore possible to provide a spatial image type display which has mechanical strength and high precision.

Since the viewer need not wear glasses or the like, it is possible to provide a spatial image type display of high convenience.

Since the front display device 4 and the rear display device 5 are made of organic EL displays, stereoscopic images of high brightness can be achieved to allow stereoscopic display of sharpness and high quality.

Moreover, stereoscopic images of high brightness can be achieved with lower power consumption, along with a wider viewing angle. That is, the viewer, even when viewing the display unit 2 obliquely, can see sharp stereoscopic images without much deterioration in image quality.

Furthermore, not only still images but also moving images can be displayed stereoscopically.

As above, according to the present embodiment, various problems of the conventional art can be solved all at once. It is thus possible to provide a spatial image type display of smaller thickness and lighter weight which are needed in such electronic equipment as a cellular phone, a PDA, a personal computer, and a vehicle-mounted navigation system, thereby allowing application to general uses.

Second Embodiment

Now, a second embodiment of the spatial image type display of the present invention will be described with reference to FIGS. 11(a) through 13(b). In FIGS. 11(a)-13(b), the parts identical or equivalent to those of the spatial image type display of the first embodiment shown in FIGS. 1(a)-8(b) are designated by the same reference numerals.

Figure 11A:
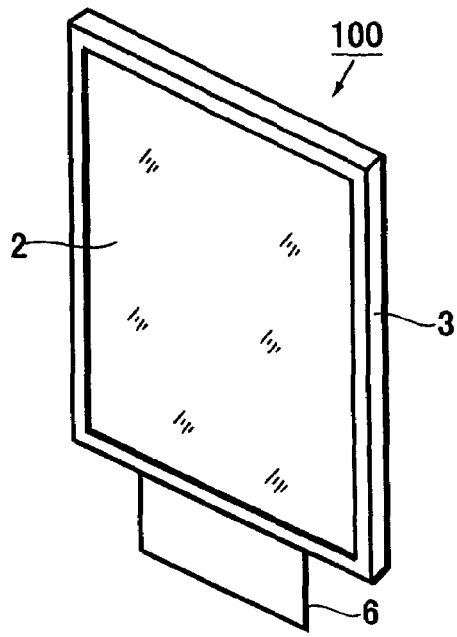
FIGS. 11(a) and 11(b) are diagrams showing the external shape and sectional structure of the spatial image type display according to a second embodiment.

A spatial image type display 100 of the present embodiment has an extremely thin structure as shown in a perspective view of FIG. 11(a).

Figure 11B:
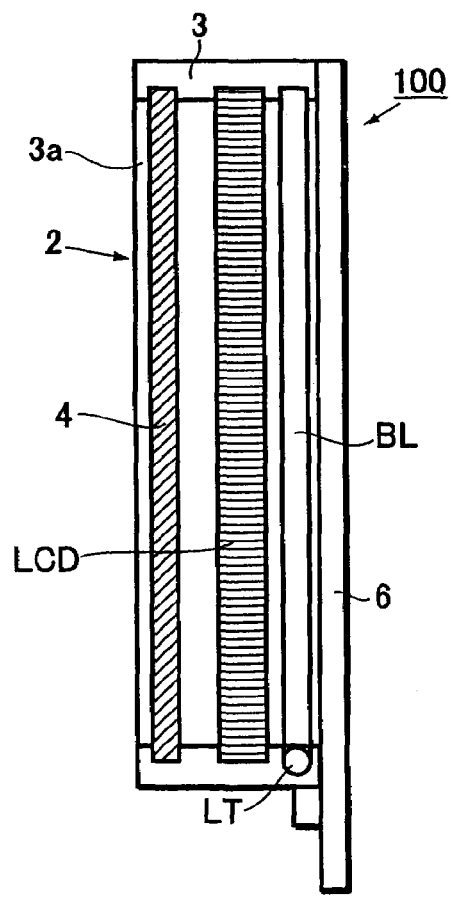

As shown in an enlarged sectional view (FIG. 11(b)) taken along the depth direction, the display unit 2 consists of a thin front display device 4 and rear display device LCD which are closely arranged with a predetermined spacing therebetween. The front display device 4 is directed toward the viewer through an opening 3a of the frame 3. The rear display device LCD is arranged behind the front display device 4.

An electric circuit substrate 6 is attached to the rear end of the frame 3 appropriately. The electric circuit substrate 6 has a display control circuit for displaying images on the front display device 4 and the rear display device LCD, respectively. When video signals are supplied to the electric circuit substrate 6 from an image information source, such as a video signal generating unit, the display control circuit mentioned above supplies the front display device 4 and the rear display device LCD with respective image data signals for image display.

The front display device 4 is made of an active matrix type organic EL display capable of full color display, which has been described in the first embodiment.

The rear display device LCD is made of an active matrix type liquid crystal display, capable of full color display. A backlight BL is arranged behind the rear display device LCD. The backlight BL projects white light emitted from a light source LT toward the rear display device LCD.

The front display device 4 and the rear display device LCD are formed with the numbers of pixels, resolution, and display size set as appropriate to the target electronic equipment.

Figure 12A:
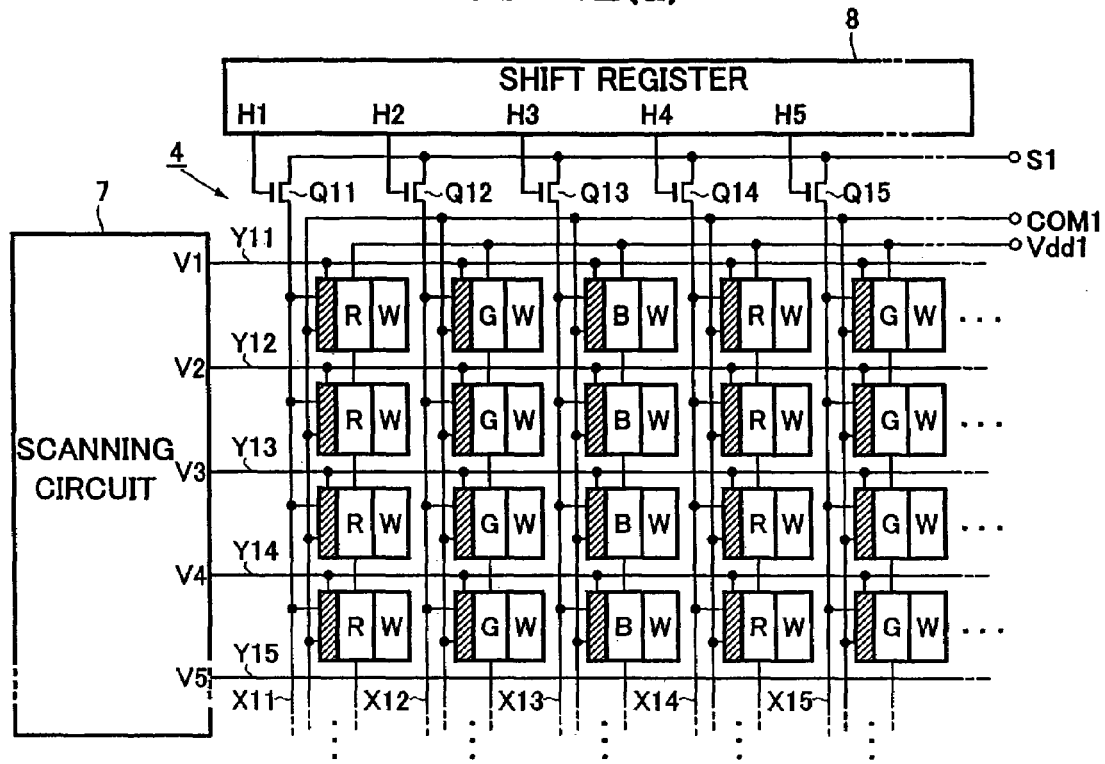
FIGS. 12(a) and 12(b) are diagrams showing the structures of a front display device and a rear display device arranged in the spatial image type display shown in FIGS. 11(a) and 11(b)
Figure 12B:
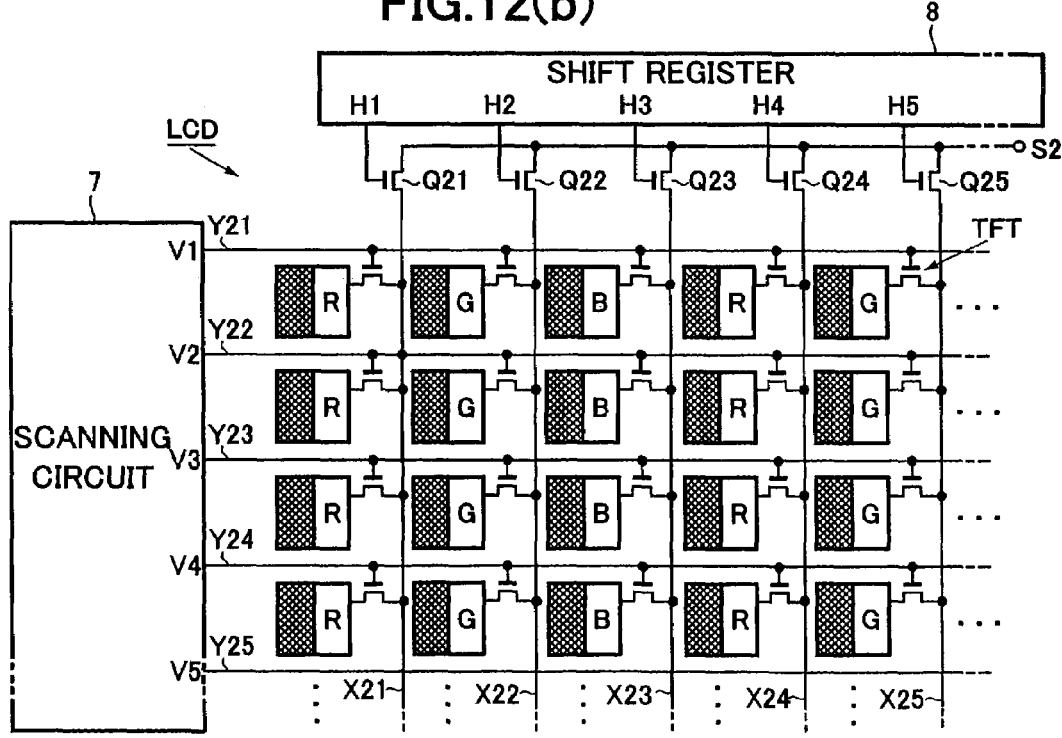

FIGS. 12(a) and 12(b) show the matrix structures of the pixels formed on the display surfaces of the front display device 4 and the rear display device LCD, respectively.

Here, FIG. 12(a) shows the pixel matrix of the front display device 4, and FIG. 12(b) the pixel matrix of the rear display device LCD. The pixels of the front display device 4 and those of the rear display devices 5 are shown associated with each other in physical relationship.

The front display device 4 shown in FIG. 12(a) has the same structure as that of the front display device 4 shown in FIG. 2(a). Numbers of independent sub pixels for emitting red (R) light, green (G) light, and blue (B) light are arranged vertically and horizontally at respective regular pixel pitches. Transparent regions (W) are formed beside the respective sub pixels. The transparent regions (W) transmit light emitted from red (R), green (G), and blue (B) sub pixels which are formed in a matrix on the rear display device LCD shown in FIG. 12(b).

On the front display device 4, red, green, and blue (R, G, and B), three sub pixels adjoining horizontally constitute each single pixel. The red (R) light, green (G) light, and blue (B) light emitted from these three sub pixels reproduce a single pixel of color.

On the rear display device LCD, numbers of independent sub pixels for emitting red (R) light, green (G) light, and blue (B) light are also arranged vertically and horizontally at respective regular pixel pitches. Red, green, and blue (R, G, and B), three sub pixels adjoining horizontally constitute each single pixel. The red (R) light, green (G) light, and blue (B) light emitted from these three sub pixels reproduce a single pixel of color.

The pixel pitches of the rear display device LCD are almost the same as those of the front display device 4, and the total number of sub pixels is almost the same as that of the front display device 4.

That is, the display surface of the rear display device LCD has size, the number of pixels, and resolution almost the same as those of the display surface of the front display device 4. As a result, the sub pixels of the rear display device LCD and the sub pixels of the front display device 4 are in near perfect alignment spatially.

As seen in the direction of the optical axis (the direction of emission of light), the sub pixels of the rear display device LCD are aligned opposite to the respective transparent regions W formed on the front display device 4.

Consequently, as is schematically shown in the perspective view of FIG. 3, the red, green, and blue (R, G, and B), three sub pixels which constitute each single pixel formed on the front display device 4 emit R light, G light, and B light toward the viewer, respectively. The red, green, and blue (R, G, and B), three sub pixels which constitute each single pixel formed on the rear display device LCD emit R' light, G' light, and B' light, respectively, which are transmitted through the three transparent regions W formed next to the foregoing sub pixels of the front display device 4, and emitted toward the viewer.

Since the pixels of the front display device 4 and those of the rear display device LCD are thus aligned spatially, the pixels of the front display device 4 and the rear display device LCD in alignment with each other constitute three-dimensional pixels having a depth.

Returning to FIG. 12(b), a number of gate lines Y21, Y22, Y23, Y24, Y25 . . . extending horizontally for the sake of vertical scanning and a number of data lines X21, X22, X23, X24, X25 . . . extending vertically for the sake of supply of an image data signal S2 are formed between the sub pixels of the rear display device LCD.

The gate lines Y21, Y22, Y23, Y24, Y25 . . . are connected with the scanning circuit 7. The scanning circuit 7 outputs the address signals V1, V2, V3, V4, V5 . . . to the gate lines Y21, Y22, Y23, Y24, Y25 . . . , respectively. The address signals vary in logic level successively and exclusively in synchronization with horizontal scanning periods.

The data lines X21, X22, X23, X24, X25 . . . are connected with transistors Q21, Q22, Q23, Q24, Q25 . . . , respectively, which are analog switches arranged in the display control circuit (not shown). These transistors Q21, Q22, Q23, Q24, Q25 . . . are then connected to the shift register 8.

That is, in accordance with the dot sequential scanning signals H1, H2, H3, H4, H5 . . . to be supplied from the shift register 8, the transistors Q21, Q22, Q23, Q24, Q25 . . . turn on/off successively and exclusively in synchronization with the dot sequential scanning periods so that the image data signal S2 is assigned and supplied to the data lines X21, X22, X23, X24, X25 . . . in succession.

TFT transistors are formed as analog switches at the portions where the gate lines Y21, Y22, Y23, Y24, Y25 . . . and the data lines X21, X22, X23, X24, X25 . . . intersect each other. The address signals V1, V2, V3, V4, V5 . . . are applied to the gates of these TFT transistors so that the image data signal S2 is supplied to the respective sub pixels.

Figure 13A:
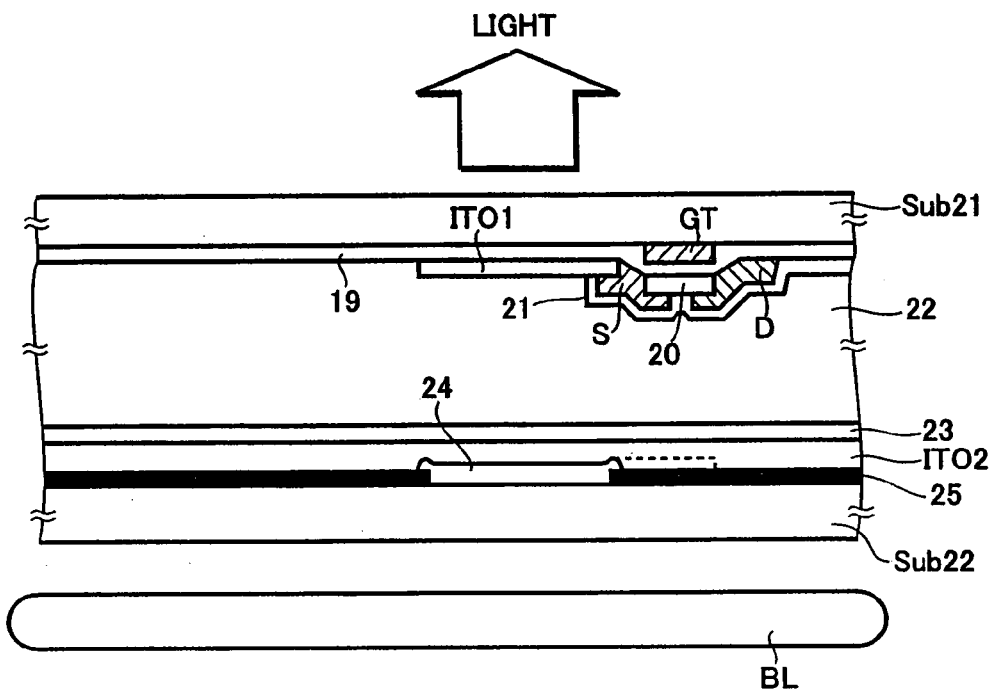
FIGS. 13(a) and 13(b) are diagrams showing the structure of a sub pixel formed on the rear display device arranged in the spatial image type display shown in FIGS. 11(a) and 11(b)
Figure 13B:
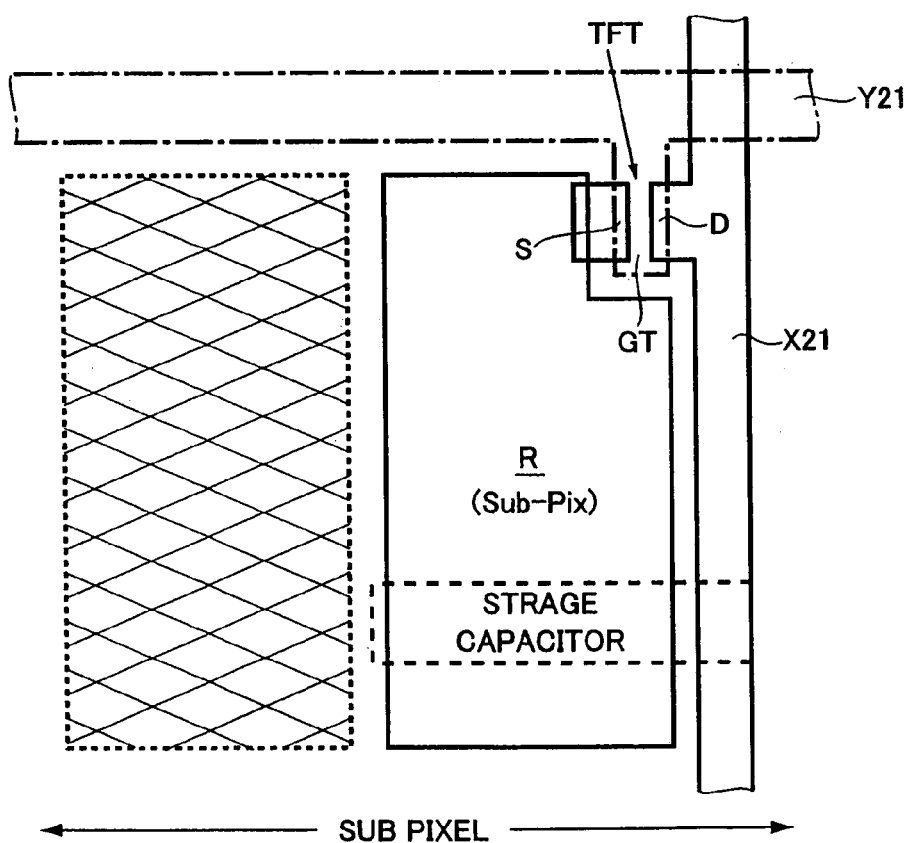

FIGS. 13(a) and 13(b) show the device structure of each sub pixel on the rear display device LCD, which is made of the active matrix type liquid crystal display capable of full color display.

Here, FIG. 13(a) is a sectional view showing the structure of essential parts of each single sub pixel and its TFT transistor. For convenience of explanation, FIG. 13(a) represents the structure of essential parts of the TFT transistor of the sub pixel for emitting red (R) light which is formed at the intersection of the gate line Y21 and the data line X21 shown in FIG. 12(b). FIG. 13(b) is a layout diagram corresponding to the sectional view.

In FIGS. 13(a) and 13(b), a gate electrode GT, or a part of the gate line Y21, is laminated on the surface of a transparent glass substrate Sub21 which is opposed to the front display device 4. An insulating layer 19 is also laminated. A transparent electrode layer ITO1 and an amorphous silicon (a-Si) layer 20 are further laminated on the insulating layer 19. The transparent electrode layer ITO1 is given the size of a sub pixel. The amorphous silicon layer 20 is aligned to the gate electrode GT.

A source electrode S and a drain electrode D are laminated further. The source electrode S establishes electric connection between the amorphous silicon layer 20 and the transparent electrode layer ITO1. The drain electrode D is a part of the data line X21. The gate electrode GT, the source electrode S, and the drain electrode D thus formed on the amorphous silicon layer 20 make a TFT transistor. The entire TFT transistor is covered with an insulating layer 21.

A transparent glass substrate Sub22 is arranged on the side of the backlight BL. A color filter 24 given the size of the sub pixel is formed on the surface of the glass substrate Sub22 as opposed to the transparent electrode layer ITO1. Moreover, a shielding layer 25 is formed on the areas other than the color filter 24. A transparent electrode layer ITO2 and a light distribution film 23 are laminated as a common electrode on the color filter 24 and the shielding layer 25. Then, as shown in the diagrams, liquid crystal 22 is filled and sealed in between the glass substrates Sub21 and Sub22.

In the structure, when the gate line Y21 is supplied with the address signal V1, the TFT transistor turns on so that the image data signal S2 is supplied to the transparent electrode layer ITO1 through the data line X21. Then, the voltage between the transparent electrode layer ITO1 and the transparent electrode layer ITO2, or the common electrode, changes the orientation of the liquid crystal 22. The change of orientation and the light distribution film 23 combine to change the light transmittance of the liquid crystal 22. Consequently, the white light emitted from the backlight BL is colored through the color filter 24 and passes through the liquid crystal 22. Here, the light is modulated in intensity according to the foregoing change in transmittance, and reaches the transparent electrode layer ITO1. The intensity-modulated light is then emitted toward the front display device 4 through the glass substrate Sub21.

Incidentally, the other sub pixels are also provided with any of red, green, and blue (R, G, and B) color filters as the color filter 24, thereby allowing color display.

Next, description will be given of the operation of the spatial image type display device 100 having such configuration.

Note that the front display device 4 made of an organic EL display and the rear display device LCD made of a liquid crystal display differ from each other in the driving method of the image data signals S1 and S2, due to differences in physical properties, device structures, and so on.

For example, the front display device 4, made of an organic EL display, is capable of DC drive with the image data signal S1. On the contrary, the rear display device LCD, made of a liquid crystal display, is typically AC-driven by the image data signal S2 so that the reproduced image improves in contrast.

Nevertheless, the basic display principles for driving the sub pixels based on the image data signals S1, S2 are the same. Description will thus be given of the operation upon the basic principle.

As is described in FIG. 7, the image data signals S1 and S2 are initially supplied to the front display device 4 and the rear display device LCD, respectively, while scanning is performed in synchronization with the horizontal scanning periods, the dot sequential scanning periods, and the frame periods.

Both the image data signal S1 and the image data signal S2 are basically the same as the video signal VD which is supplied from a video signal generating unit or the like.

Note that the amplitudes of the image data signals S1 and S2 are set in accordance with the depth of each portion of the stereoscopic image with respect to a reference position, which is the assumed position of the viewer.

That is, to display a portion of the stereoscopic image closer to the foregoing reference position, the image data signal S1 is rendered higher than the image data signal S2 in amplitude. In contrast, to display a portion farther from the reference position, the image data signal S1 is rendered lower than the image data signal S2 in amplitude.

In this way, the image data signals S1 and S2 adjusted in amplitude are generated in synchronization with horizontal scanning periods, a single frame period, and dot sequential scanning periods. The image data signals S1 and S2 generated are supplied to the front display device 4 and the rear display device LCD to show images on the respective display surfaces.

Figure 8A:
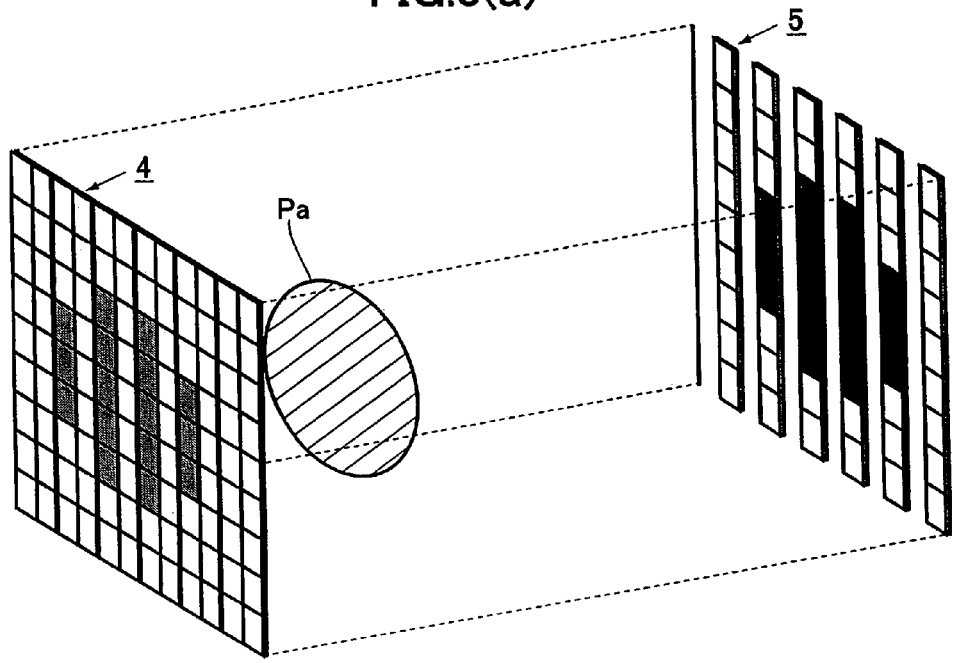
FIGS. 8(a) and 8(b) are diagrams showing the display principle of the spatial image type display of the first embodiment.

Thus, images appear on the front display device 4 and the rear display device LCD. As is shown in FIG. 8(a), when image data signals S1 of higher amplitudes are supplied to the front display device 4 and image data signals S2 of lower amplitudes are supplied to the rear display device LCD, the front display device 4 shows an image of higher brightness and the rear display device LCD shows an image of lower brightness. This gives the viewer the illusion that an image Pa lies at a position closer to the front display device 4.

Figure 8B:
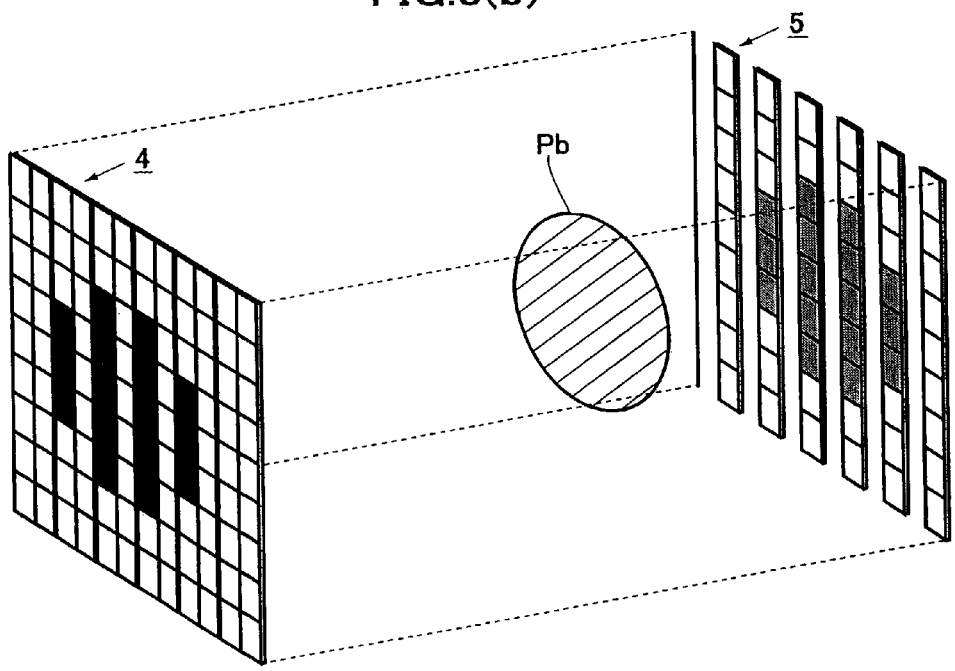

As is shown in FIG. 8(b), when image data signals S1 of lower amplitudes are supplied to the front display device 4 and image data signals S2 of higher amplitudes are supplied to the rear display device LCD, the front display device 4 shows an image of lower brightness and the rear display device LCD shows an image of higher brightness. This gives the viewer the illusion that an image Pb lies at a position closer to the rear display device LCD.

Consequently, the image data signals S1 and S2 adjusted in amplitude so as to control the brightnesses of the individual portions of the images to be displayed on the front display device 4 and the rear display device LCD can be supplied to reproduce and display a stereoscopic image to the viewer.

Figure 10:
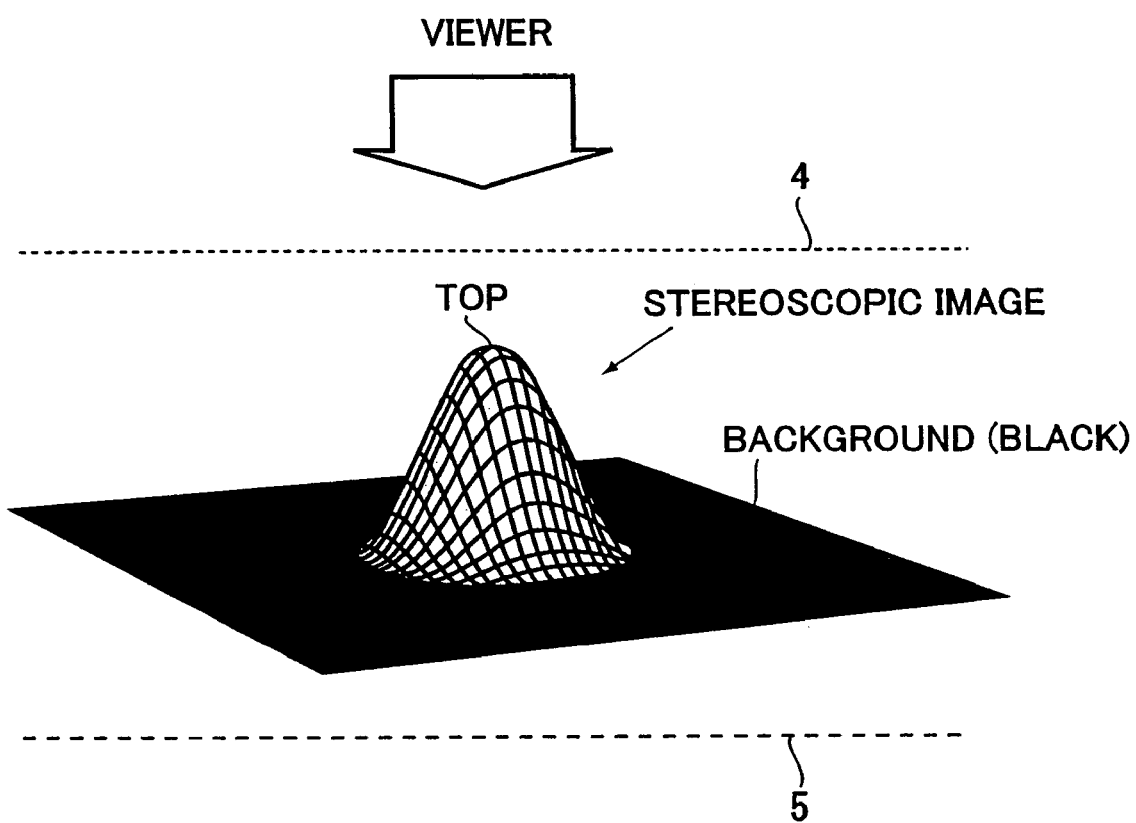
FIG. 10 is a diagram showing an example of the subject image to be displayed in the display example of FIG. 9.

For example, when the subject image as shown in FIGS. 9(a) and 9(b) is displayed on the front display device 4 while the subject image as shown in FIGS. 9(c) and 9(d) is displayed on the rear display device LCD, the three-dimensional image of the cone-shaped stereoscopic image illustrated in FIG. 10 can be presented as viewed from the top side.

As has been described, in the spatial image type display 100 of the present embodiment (second embodiment), the front display device 4 is made of an organic EL display and the rear display device LCD is made of a liquid crystal display. This allows a reduction in thickness and weight.

Moreover, the light emitted from the sub pixels of the rear display device LCD is transmitted through the transparent regions W formed on the front display device 4. The transmitted light and the light emitted from the sub pixels formed on the front display device 4 can be combined to determine the color and spatial position of the stereoscopic image. This eliminates the need for a complicated optical system as in the conventional art. It is therefore possible to provide a spatial image type display which has mechanical strength and high precision.

Since the viewer need not wear glasses or the like, it is possible to provide a spatial image type display of high convenience.

Since the front display device 4 is made of an organic EL display and the rear display device LCD has the backlight BL, stereoscopic images of high brightness can be presented to achieve stereoscopic display of sharpness and high quality.

Furthermore, not only still images but also moving images can be displayed stereoscopically.

As above, according to the present embodiment, various problems of the conventional art can be solved all at once. It is thus possible to provide a spatial image type display of smaller thickness and lighter weight which are needed in such electronic equipment as a cellular phone, a PDA, a personal computer, and a vehicle-mounted navigation system, thereby allowing application to general uses.

While the first and second embodiments described above have dealt with the cases where red, green, and blue (R, G, and B) sub pixels are arranged in vertical stripes, it is possible to adopt other array structures such as a mosaic array and a triangle array.

Moreover, the foregoing description has dealt with the spatial image type displays in which stereoscopic display is achieved by two display devices, or the front display device 4 and the rear display device 5 (or LCD) overlaid with a predetermined spacing therebetween. Nevertheless, it is possible to adopt the structure that three or more display devices are overlaid with predetermined spacings therebetween.

In the structure that three or more display devices are overlaid with predetermined spacings, the light emitted from the sup pixels of the display devices lying behind must be transmitted through the display devices lying in front. Stereoscopic display is thus achieved by such measures as providing the display devices to be arranged closer to the viewer with more transparent regions W for transmitting the light from the display devices behind, or with transparent regions W of greater areas.

Even in the structure that three or more display devices are overlaid with predetermined spacings, the individual display devices must be of self luminescence type.

To meet this requirement, the spatial image type display having three or more display devices is realized by making all the display devices out of organic EL displays as described in the first embodiment.

Now, when a spatial image type display having three or more display devices is realized by using the liquid crystal display described in the second embodiment, a backlight is required since the liquid crystal display itself is not of self luminescence type. Then, the liquid crystal display is desirably arranged at the rearmost position while the other display devices are made of organic EL displays.

Instead of the liquid crystal display, a plasma display panel (PDP) may be used as the rearmost display panel. Depending on the intended use, a CRT display may also be used as the rearmost display device.

While the embodiments described above are intended to show three-dimensional stereoscopic images in color, the display surfaces of the display devices may consist of sub pixels for intensity luminescence alone. In this case, stereoscopic images can be displayed in monochrome.

In the spatial image displays of the foregoing first and second embodiments, as shown in FIG. 3, the sub pixels formed on the front and rear display devices constitute stereoscopic pixels with a combination of red (R), green (G), and blue (B), three sub pixels adjoining one another as each single pixel. Then, the stereoscopic pixels are individually adjusted in brightness as appropriate to display stereoscopic images.

Nevertheless, the spatial image type display of the present invention is not under the restriction that brightness be adjusted pixel by pixel.

In a first modified example according to the first and second embodiments, all the sub pixels need not be adjusted in brightness pixel by pixel (dot by dot).

Figure 14A:
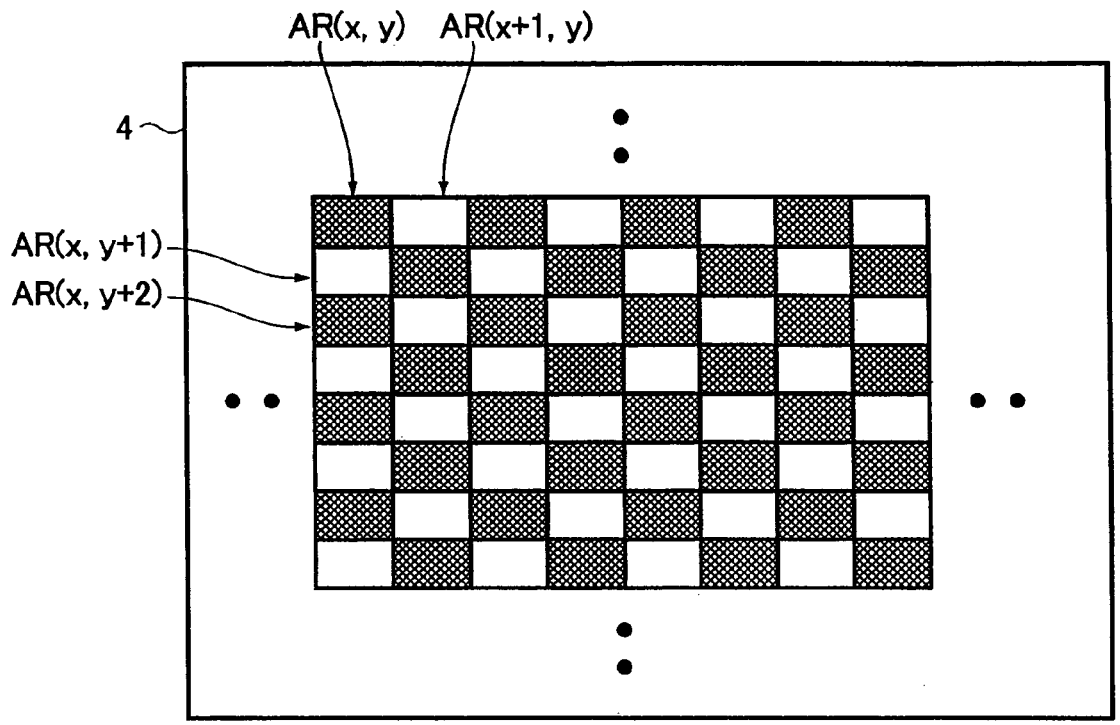
FIGS. 14(a) and 14(b) are diagrams for explaining a method for stereoscopic display according to a first modified example.
Figure 14B:
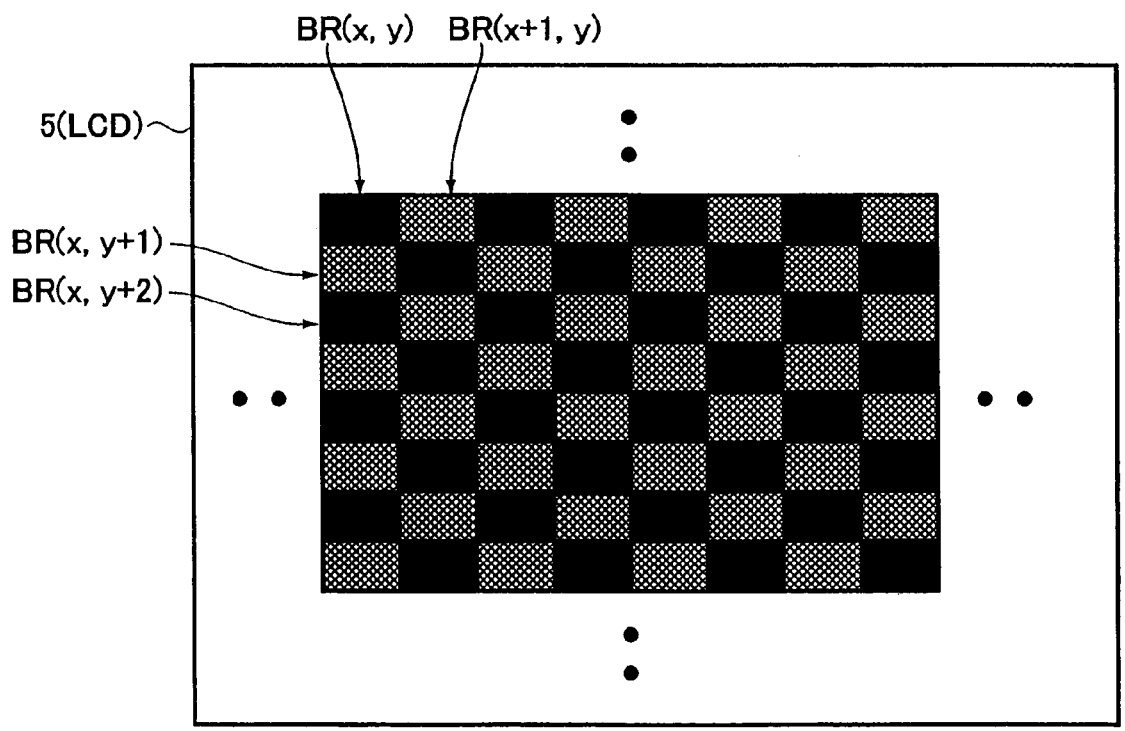

More specifically, FIG. 14(a) shows a method for pixel-by-pixel brightness adjustment on the front display device 4. FIG. 14(b) shows a method for pixel-by-pixel brightness adjustment on the rear display device 5 (or LCD).

Here, as shown in FIG. 14(a), the pixels aligning horizontally on the display surface of the front display device 4 are alternately kept turned off for interlaced image display.

For example, the pixels in staggered positions, such as the hatched pixels AR(x,y), AR (x,y+2) . . . , are lit with brightness adjustment. Meanwhile, the unhatched pixels such as AR(x+1,y), AR(x,y+1) . . . are kept turned off. These pixels AR(x+1,y), AR(x,y+1), . . . kept turned off shall transmit the light emitted from the pixels of the rear display device 5 (or LCD) through the aforementioned transparent regions W thereof.

As concerns the pixels of the rear display device 5 (or LCD), the pixels BR(x+1,y), BR(x,y+1), . . . in staggered positions corresponding to the off pixels of the front display devices 4 are lit with brightness adjustment. The remaining pixels BR(x,y), BR(x,y+2) . . . lying between the pixels BR(x+1,y), BR(x,y+1) . . . are turned off.

In this way, the pixels of the front display device 4 and those of the rear display device 5 (or LCD) may be alternately turned off in spatially opposite phases while the rest of the pixels are adjusted in brightness for image display.

By such a display method, stereoscopic images can also be displayed though with lower spatial resolution. This can reduce the load of signal processing on the display control circuit for generating the image data signals in displaying moving images stereoscopically in particular. This provides such effects that stereoscopic moving images can be displayed with smooth movement.

Incidentally, while FIGS. 14(a) and 14(b) illustrate the case where the pixels are lit on/off every other alternately, the alternation need not be pixel by pixel.

Figure 15A:
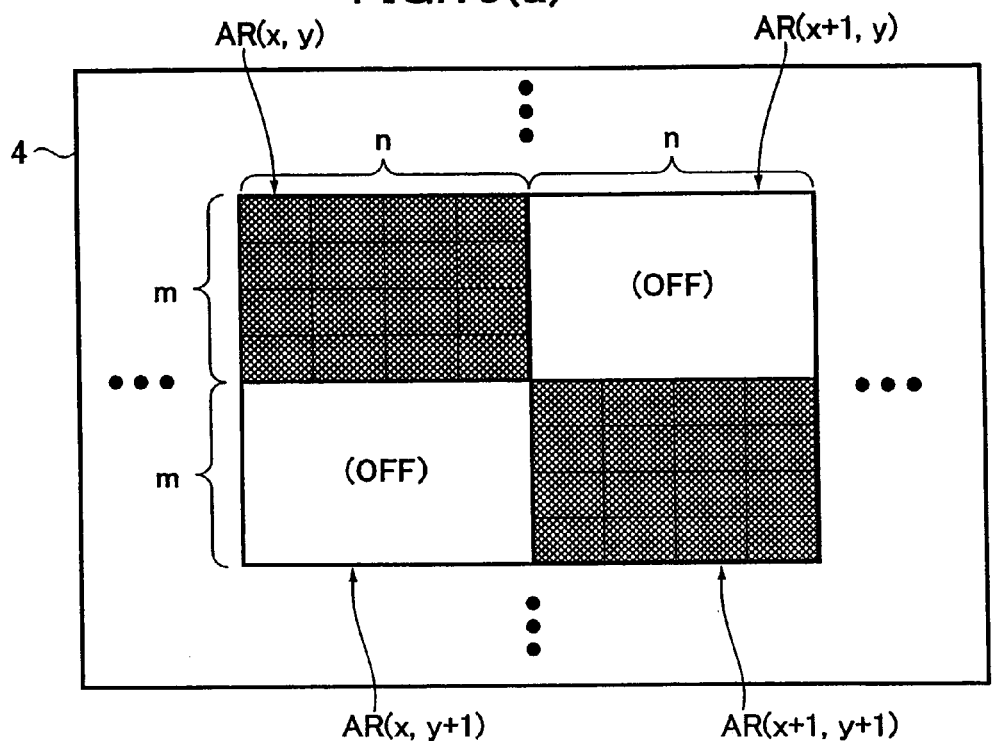
FIGS. 15(a) and 15(b) are diagrams for explaining another method for stereoscopic display according to the first modified example.
Figure 15B:
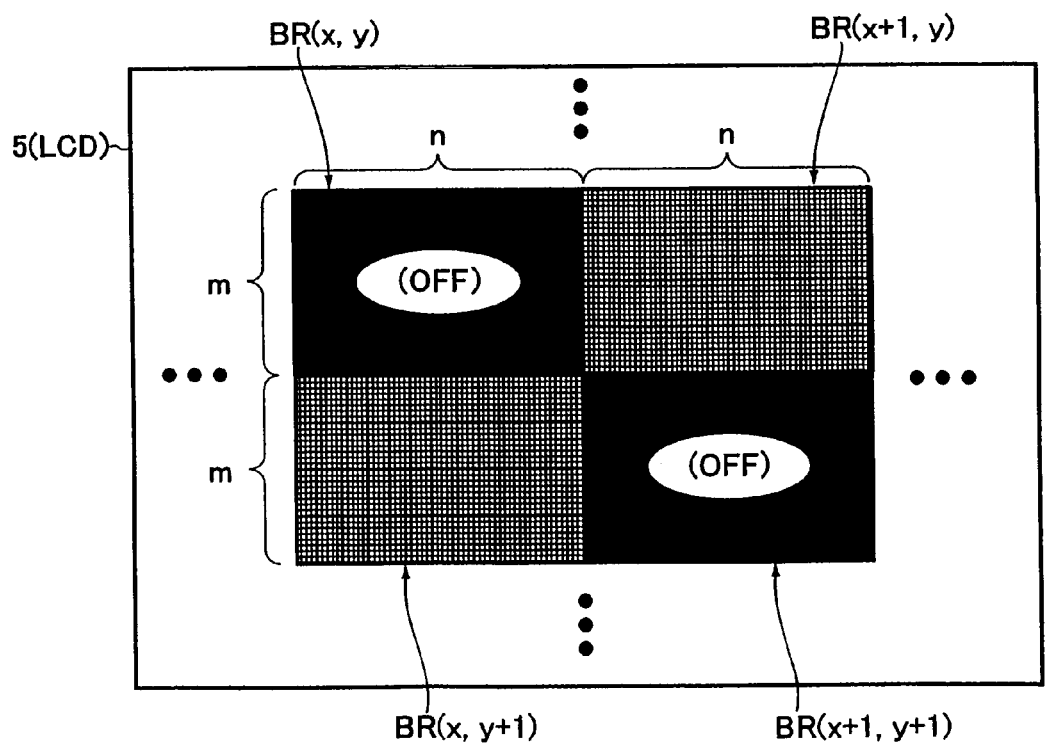

For example, as shown in FIGS. 15(a) and 15(b), the pixels formed on the front display devices 4 may be lit on/off alternately unit by unit, with m columns and n rows of pixels as each single unit. Similarly, the pixels of the rear display device 5 (or LCD) may be lit on/off alternately unit by unit in a spatial phase opposite from in the front display device 4, with m×n pixels as each single unit.

The foregoing m×n pixels may be set as appropriate, whereas the numbers m and n are desirably determined in consideration of such factors as deterioration in image quality.

FIGS. 14(a)-15(b) illustrate the cases where the pixels of the front display device 4 and the rear display device 5 (or LCD) are formed at the same pixel pitches, and the front display device 4 and the rear display device 5 (or LCD) conduct actual image display with the same resolution.

Nevertheless, the front display device 4 and the rear display device 5 (or LCD) may have different resolutions in actual image display. That is, stereoscopic display can be achieved by the front display device 4 showing an image with higher resolution and the rear display device 5 (or LCD) showing an image with lower resolution.

For example, the front display device 4 may be set at a resolution as shown in FIG. 14(a), and the rear display device 5 (or LCD) a resolution as shown in FIG. 15(b).

Otherwise, stereoscopic display can also be achieved by the front display device 4 showing images with lower resolution and the rear display device 5 (or LCD) showing images with higher resolution during actual image display.

For example, the front display device 4 may be set at a resolution as shown in FIG. 15(a), and the rear display device 5 (or LCD) a resolution as shown in FIG. 14(b).

Moreover, in actual image display, the pixels to be lit on/off need not be set to staggered positions as shown in FIGS. 14(a)-15(b). For example, pixels to be turned off may be arranged in stripes or in triangles. The front display device 4 and the rear display device 5 (or LCD) may differ in the arrangement of the pixels to be lit on/off.

Furthermore, the pixels of the front display device 4 and the rear display device 5 (or LCD) need not be formed at the same pixel pitches in the first place.

That is, the sub pixels of the front display device 4 and the rear display device 5 (or LCD) may be formed at different pixel pitches from the beginning.

If the front display device 4 and the rear display device 5 (or LCD) are formed with different pixel pitches from the beginning, the arrangement of the color pixels of the front display device 4 and the arrangement of the color pixels of the rear display device 5 (or LCD) may differ from each other.

When the front display device 4 and the rear display device 5 (or LCD) show images with different resolutions as above, the image of higher resolution can interpolate the image of lower resolution in image quality. It is thus possible to prevent the reproduced stereoscopic image from deterioration in image quality.

Besides, displaying images on the front display device 4 and the rear display device 5 (or LCD) with different resolutions allows a reduction in the load of signal processing on the display control circuit. This provides such effects that stereoscopic moving images can be displayed with smooth movement.

The transparent regions W formed on the front display device 4 need not be formed at pitches conforming to the pixel pitches of the sub pixels formed on the front display device 4. That is, stereoscopic display can be achieved by forming the transparent regions W with pitches and arrangement adjusted to at least the resolution or the like of the images displayed on the rear display device 5 (or LCD).

In the first and second embodiments including the first modified example described above, the front display device 4 and the rear display device 5 (or LCD) achieve stereoscopic display by showing spatially-aligned images with adjusted brightnesses, respectively.

However, the present invention is not limited to such spatially-aligned display. With reference to FIGS. 16(a)-16(d), a second modified example of the first and second embodiments will be described below.

For the sake of simple explanation, the description will be given of the stereoscopic display for situations where the cone-shaped subject image shown in FIG. 10 is viewed from the top side.

In the display method of FIGS. 9(a)-9(d) described previously, the front display device 4 and the rear display device 5 (or LCD) show images which are different in brightness though overlaid spatially.

In contrast, according to the second modified embodiment, the cone-shaped subject image mentioned above is split into a plurality of parts. One of the split partial images is displayed on the display surface of the front display device 4, and the rest of the partial images on the display surface of the rear display device 5 (or LCD).

Figure 16A:
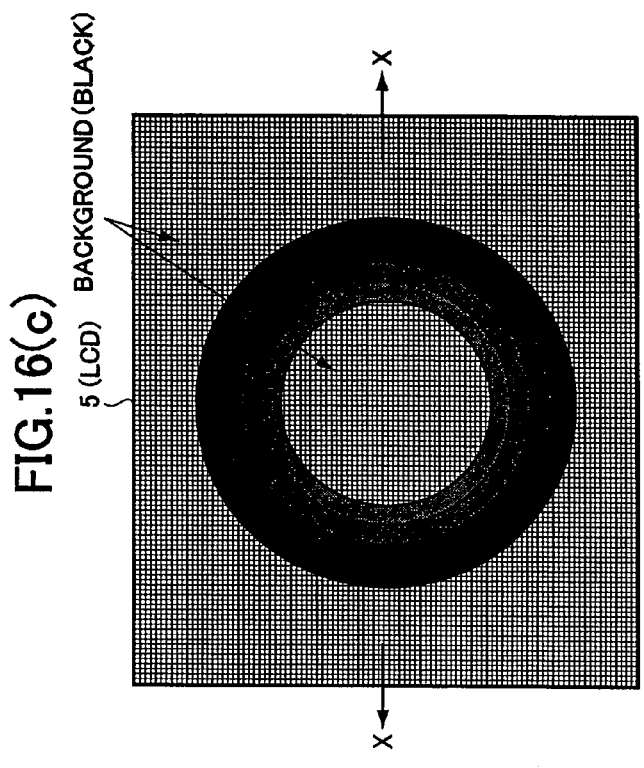
FIGS. 16(a)-16(d) are diagrams for explaining a method for stereoscopic display according to a second modified example.

For example, when the foregoing cone-shaped subject image is displayed in two, split display is conducted such that the top part of the cone-shaped subject image is displayed on the front display device 4 as shown in FIG. 16(a) and the remaining bottom part of the cone-shaped subject is displayed on the rear display device 5 (or LCD).

Then, the sub pixels lying in the annular area around the image of the top part on the front display device 4 (the annular area shown in white in the diagram) are not lit on (are turned off), so that the transparent regions W in the annular area transmit the image of the bottom part displayed on the rear display device 5 (or LCD).

Meanwhile, the rear display device 5 (or LCD) displays the aforementioned bottom part of the cone-shaped subject image, at which time the sub pixels lying in the area inside the bottom part are turned off. That is, turning off the sub pixels lying in the area of the rear display device 5 (or LCD) corresponding to the image of the top part displayed on the front display device 4 prevents light from being emitted from the rear display device 5 (or LCD) onto the image of the top part displayed on the front display device 4.

Figure 16B:
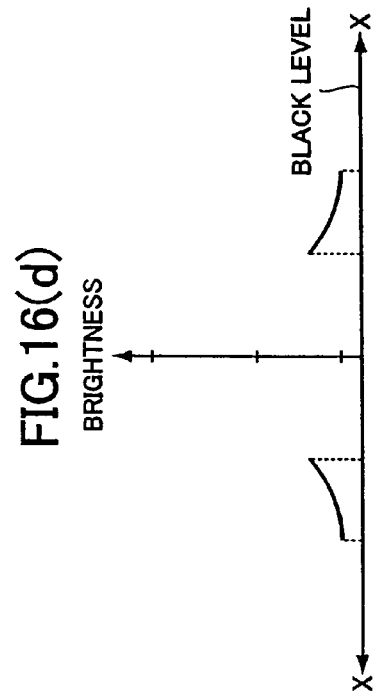

In addition, the image of the top part displayed on the front display device 4 is adjusted in brightness as shown in FIG. 16(b). The image of the bottom part displayed on the rear display device 5 (or LCD) is adjusted in brightness as shown in FIG. 16(d).

Under such split display, the image of the top part appearing on the front display device 4 can be shown as if it lies closer to the viewer, and the image of the bottom part appearing on the rear display device 5 (or LCD) as if it lies farther (deeper) than the image of the top part.

The images displayed in two are synthesized with perspective, allowing stereoscopic display as if the stereoscopic, cone-shaped subject image shown in FIG. 10 is viewed from the top side.

As above, according to the second modified example, the front display device 4 and the rear display device 5 (or LCD) can show stereoscopic images not necessarily by displaying basically the same images and synthesizing the two frame images, but also by displaying different images for interpolation between the two frame images.

Figure 16C:
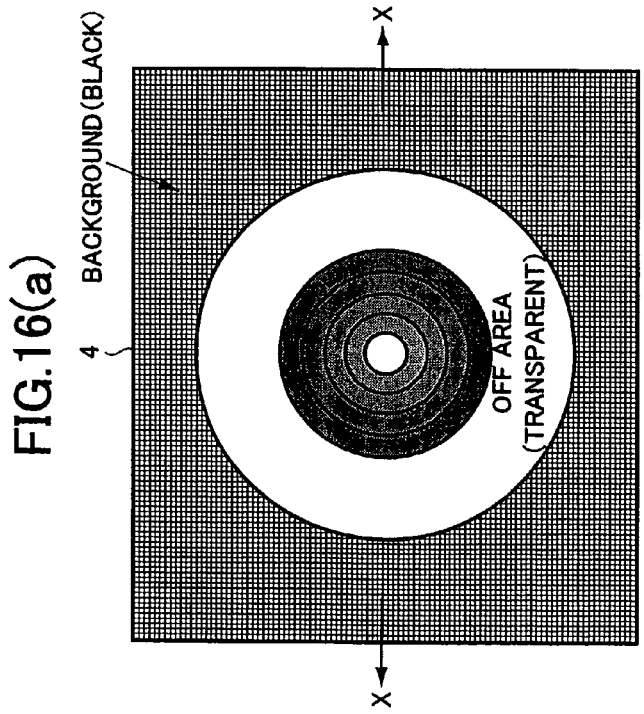
Figure 16D:
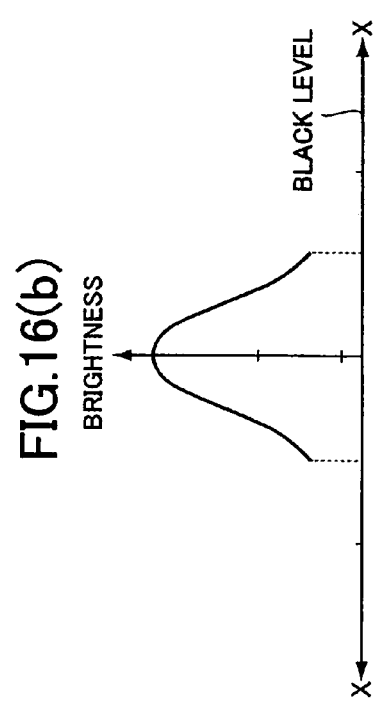
Figure 17:
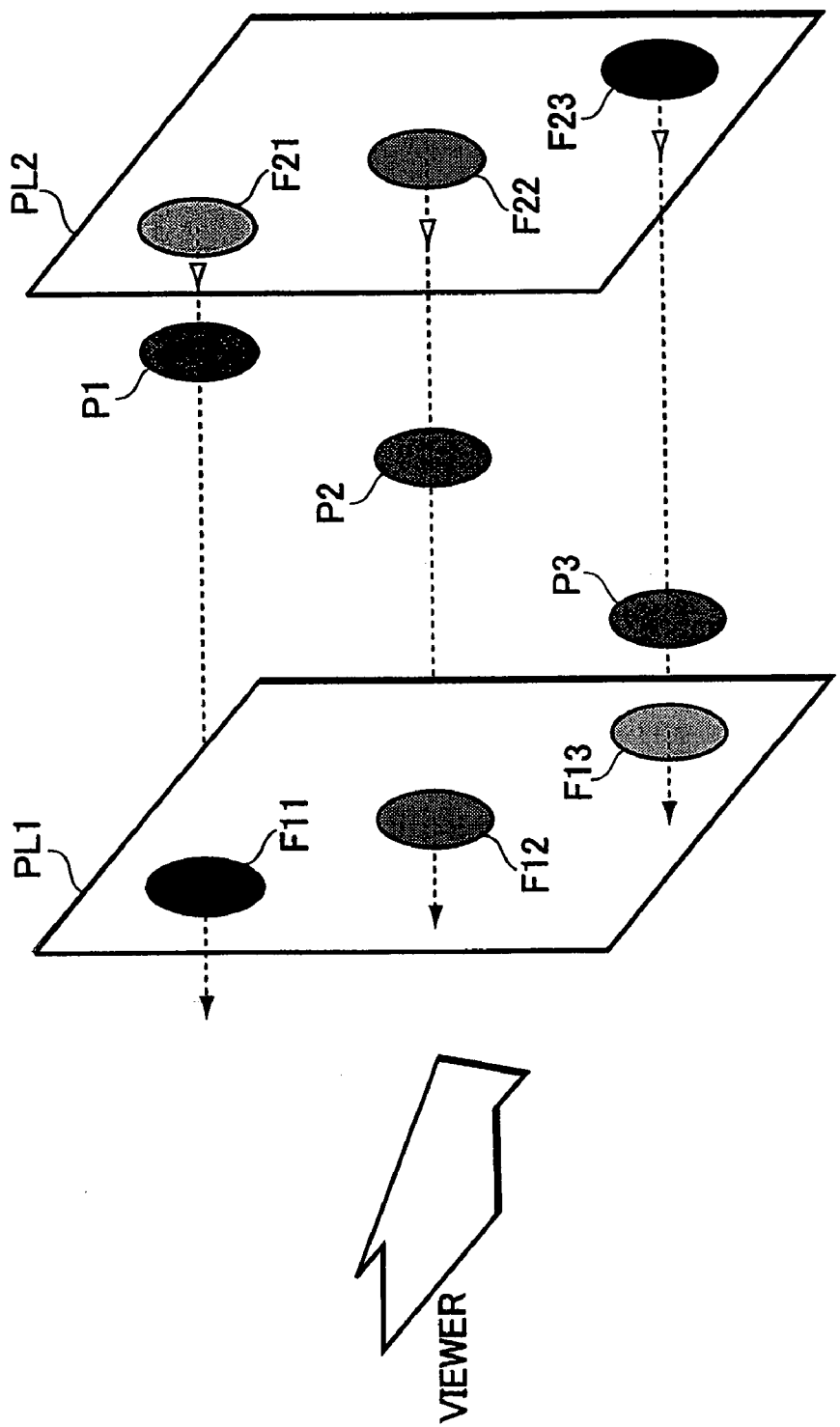
FIG. 17 is a diagram showing the principle of conventional stereoscopic display.
Figure 18:
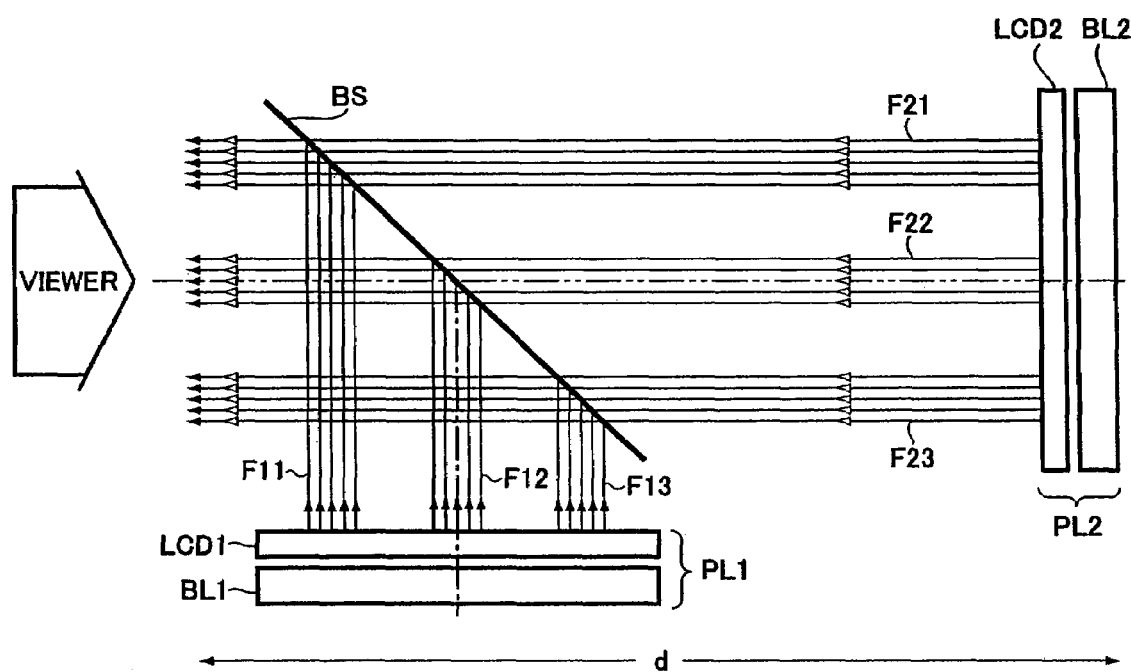
FIG. 18 is a diagram showing the configuration of a conventional spatial image type display according to the principle of stereoscopic display shown in FIG. 17.

Moreover, sub pixels lying in the annular off area shown in FIG. 16(a) may be lit with appropriate resolution and brightness while sub pixels lying in the area inside the image of the bottom part of the subject image shown in FIG. 16(c) (the circular area where the sub pixels are turned off to show black as in the background) are lit with appropriate resolution and brightness. In this case, images different from the foregoing cone-shaped subject image can be displayed in these areas.

Consequently, when the cone-shaped subject image is displayed in parts and different images are displayed as well, there is obtained such an effect that different images appear through the stereoscopic image of the cone-shaped subject as viewed from the top side.

As has been described, the spatial image type displays of the first and second embodiments including the first and second modified examples provide the excellent effect that stereoscopic display can be achieved by various display methods.

Besides, the various display methods described previously may be combined to provide a spatial image type display which is capable of highly-expressive stereoscopic display and has new excellent functions which are heretofore unattainable.

In addition, planar two-dimensional display is available aside from the three-dimensional stereoscopic display. This provides such effects that these displays of different dimensions can be made between frame images or within frame images to offer highly expressive images.

INDUSTRIAL APPLICABILITY

As has been described, in the spatial image type display of the present invention, the front and rear display devices lying in front and behind show images on their respective display surfaces. At the time of display, the image displayed on the rear display device is transmitted through the transparent regions of the front display device so that it shows with the image displayed on the front display device. This eliminates a complicated optical system or the like, and allows a reduction in weight, thickness, size, etc. for the sake of application to general uses.

In addition, when the foregoing display devices are made of an organic EL display, a liquid crystal display, or the like, it is possible to provide a spatial image type display which achieves not only such effects as a reduction in weight, thickness, and size, but also stereoscopic display of extremely high sharpness and quality with a wider viewing angle.

The invention claimed is:

1. A spatial image type display comprising:
a frame;
a display unit enclosed by said frame;
an electric circuit substrate including a display control circuit for displaying images; and
a plurality of display devices included in said display unit, wherein
said plurality of display devices comprise a front display device having a front display surface and a rear display device aligned next to said front display device and having a rear display surface, said front display surface having a plurality of pixels for displaying image data and said rear display surface having a plurality of pixels for displaying image data and displaying the image data in a substantially same direction with a direction of the image data being displayed on said front display surface,
each of said plurality of pixels of the front and rear display surfaces of both display devices comprises at least one sub-pixel, and
each sub-pixel of said front display surface includes a displaying region for displaying the image data of said front display surface, and a transparent region that is adjacent to the display region and is aligned with a displaying region of a corresponding sub-pixel of the rear display surface so that the image data on said rear display surface is transmitted through the transparent region to a viewer.

2. The spatial image type display according to claim 1, wherein said electric circuit substrate feeds image data signals which are produced by adjusting an amplitude of a video signal to said front and rear display devices.

3. The spatial image type display according to claim 1 or 2, wherein said front display surface of said front display device and said rear display surface of said rear display device display the same image data with different brightness for a stereoscopic display.

4. The spatial image type display according to claim 2, wherein said amplitudes of the image data signals are set in accordance with a depth of each portion of the stereoscopic image with respect to a reference position, which is an assumed position of a viewer.

5. The spatial image type display according to claim 1, wherein each of said front and rear display devices is made of an organic EL display.

6. The spatial image type display according to claim 1, wherein the rear display device is made of a liquid crystal display, and the front display device is made of an organic EL display.

7. The spatial image type display according to claim 6, further comprising a backlight that is located behind the rear display device.

8. The spatial image type display according to claim 1, wherein said image data of the front and rear display surface of both display devices comprise a number of pixel data.

9. The spatial image type display according to claim 1, wherein said image data of the front and rear display surface of both display devices comprise a number of groups of pixel data.

10. The spatial image type display according to claim 1, wherein said transparent region is overlapped with a region of the image data of the rear display device.

11. The spatial image type display according to claim 1, wherein when three or more display devices are present, a rearmost display device is made of a liquid crystal display, and each of the other display devices is made of an organic EL display.

12. The spatial image type display according to claim 11, further comprising a backlight that is located behind the rearmost display device.

13. A spatial image type display having a plurality of display devices, display surfaces of said display devices being aligned with each other and having a spacing therebetween, said display comprising:
a front display device having a front display surface, said front display surface having a plurality of pixels for displaying image data; and
a rear display device aligned with said front display device and having a rear display surface, said rear display surface having a plurality of pixels for displaying image data and displaying the image data in a substantially same direction with a direction of the image data being displayed on said front display surface, wherein
each of the plurality of pixels of the front and rear display surfaces comprises at least one sub-pixel, and
each sub-pixel of said front display surface includes a displaying region for displaying image data of said front display surface, and a transparent region that is adjacent to the display region and is aligned with a displaying region of a corresponding sub-pixel of the rear display surface so that the image data on said rear display surface is transmitted through the transparent region to a viewer.

14. The spatial image type display according to claim 13, wherein said front display surface and said rear display surface display same image data with different brightness for a stereoscopic display.

15. The spatial image type display according to claim 13, wherein each of said front and rear display devices is made of an organic EL display.

16. The spatial image type display according to claim 13, wherein when three or more display devices are present, a rearmost display device is made of a liquid crystal display, and each of the other display devices is made of an organic EL display.

17. The spatial image type display according to claim 16, wherein the rearmost display device includes a rearmost display surface having a plurality of pixels for displaying image data, the rearmost display surface displaying substantially same image data and displaying the image data in a substantially same direction with its preceding display surfaces.

18. The spatial image type display according to claim 17, wherein said front display includes more than one transparent regions, each of which is aligned with a displaying region of a corresponding sub-pixel of the plurality of pixels of subsequent display devices located behind the front display device so that the image data on the subsequent display device is transmitted through the more than one transparent regions to the viewer.

19. The spatial image type display according to claim 17, wherein each of the transparent regions of said front display surface has a width sufficient to be aligned with a displaying region of a corresponding sub-pixel of the plurality of pixels of subsequent display devices located behind the front display device so that the image data on the subsequent display device is transmitted through the transparent region to the viewer.

20. The spatial image type display according to claim 19, further comprising a backlight that is located behind the rear display device.

21. The spatial image type display according to claim 16, further comprising a backlight that is located behind the rearmost display device.

22. The spatial image type display according to claim 13, wherein the front display device is made of an organic EL display and the rear display device is made of a liquid crystal display.

* * * * *